(12) United States Patent
Li et al.

(10) Patent No.: US 12,300,775 B2
(45) Date of Patent: May 13, 2025

(54) DISPLAY SUBSTRATE AND METHOD FOR MANUFACTURING THE SAME, AND DISPLAY APPARATUS

(71) Applicants: BOE MLED Technology Co., Ltd., Beijing (CN); BOE TECHNOLOGY GROUP CO., LTD., Beijing (CN)

(72) Inventors: Jinpeng Li, Beijing (CN); Haiwei Sun, Beijing (CN); Pei Li, Beijing (CN); Teng Zhang, Beijing (CN); Jian Li, Beijing (CN); Pengjun Cao, Beijing (CN); Zhiqiang Wang, Beijing (CN); Zongying Shu, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 638 days.

(21) Appl. No.: 17/760,817

(22) PCT Filed: Dec. 26, 2020

(86) PCT No.: PCT/CN2020/139715
§ 371 (c)(1),
(2) Date: Mar. 16, 2022

(87) PCT Pub. No.: WO2022/134112
PCT Pub. Date: Jun. 30, 2022

(65) Prior Publication Data
US 2023/0163264 A1    May 25, 2023

(51) Int. Cl.
*H01L 33/60* (2010.01)
*H01L 25/16* (2023.01)

(52) U.S. Cl.
CPC ............ *H01L 33/60* (2013.01); *H01L 25/167* (2013.01); *H01L 2933/0058* (2013.01)

(58) Field of Classification Search
CPC ..... H01L 33/60; H01L 33/58; H01L 25/0753; H01L 25/167; H01L 2933/0058
See application file for complete search history.

(56) References Cited

U.S. PATENT DOCUMENTS 11,088,306 B2 * 8/2021 Chen ................. H01L 33/62
11,143,808 B2 * 10/2021 Achi ................. H01L 33/60
(Continued)

FOREIGN PATENT DOCUMENTS

| CN | 107946292 | 4/2018 |
| CN | 108251001 | 7/2018 |

(Continued)

OTHER PUBLICATIONS

PCT International Search Report (w/ English translation) and Written Opinion for corresponding PCT Application No. PCT/CN2020/139715, mailed Oct. 9, 2021, 10 pages.

(Continued)

*Primary Examiner* — Vinh T Lam
(74) *Attorney, Agent, or Firm* — Dority & Manning, P.A.

(57) ABSTRACT

A display substrate includes a substrate, light-emitting devices disposed on a side of the substrate, a first light dimming layer disposed on the side of the substrate, and a first fixing layer disposed on a side of the light-emitting devices and the first light dimming layer away from the substrate. The light-emitting devices are arranged at intervals from each other and divided into a plurality of groups of light-emitting devices, and each group of light-emitting devices includes at least one light-emitting device. The first light dimming layer includes portions each located between two adjacent groups of light-emitting devices, and a gap exists between a portion of the first light dimming layer and at least one side face of at least one light-emitting device (Continued)

adjacent thereto. A portion of the first fixing layer is located in the gap. The first fixing layer is a light-transmitting film.

20 Claims, 17 Drawing Sheets

(56) References Cited

U.S. PATENT DOCUMENTS

| | | | |
|---|---|---|---|
| 11,367,849 B2 * | 6/2022 | Wu | H10K 50/856 |
| 11,600,753 B2 * | 3/2023 | Shao | H01L 33/58 |
| 11,677,048 B2 * | 6/2023 | Nakabayashi | H01L 33/58 |
| | | | 257/88 |
| 11,695,102 B2 * | 7/2023 | Hussell | G09G 3/32 |
| | | | 257/79 |
| 12,027,648 B2 * | 7/2024 | Ma | H01L 27/156 |
| 2006/0290276 A1 | 12/2006 | Cok et al. | |
| 2014/0027725 A1 | 1/2014 | Lim et al. | |
| 2014/0175404 A1 | 6/2014 | Shim et al. | |
| 2016/0293682 A1 | 10/2016 | Park | |
| 2017/0194602 A1 | 7/2017 | Cui et al. | |
| 2017/0317152 A1 | 11/2017 | Hsu | |
| 2018/0047712 A1 * | 2/2018 | Bang | G02B 6/0051 |
| 2019/0155025 A1 * | 5/2019 | Grandclerc | G02B 27/0101 |
| 2020/0105974 A1 * | 4/2020 | Ozeki | H01L 33/44 |
| 2020/0373469 A1 * | 11/2020 | Chen | H01L 33/62 |
| 2022/0028841 A1 | 1/2022 | Kishimoto | |

FOREIGN PATENT DOCUMENTS

| | | |
|---|---|---|
| CN | 208767335 | 4/2019 |
| CN | 110993674 | 4/2020 |
| CN | 111200050 | 5/2020 |
| CN | 111446348 | 7/2020 |
| CN | 111474768 | 7/2020 |
| CN | 211879404 | 11/2020 |
| TW | 201942671 | 11/2019 |
| TW | I805003 B | 6/2023 |

OTHER PUBLICATIONS

Taiwanese Office Action (w/ English translation) for corresponding Taiwanese Application No. 110136459, 14 pages.
Taiwan Office Action (w/ English translation) for corresponding TW Application No. 112115988, dated Dec. 4, 2024, 8 pages.

* cited by examiner

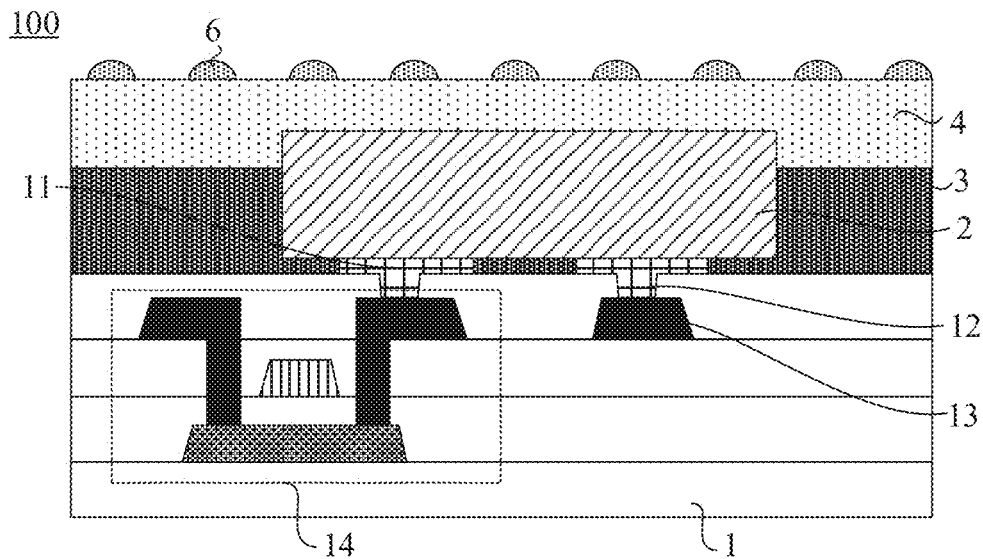

FIG. 23

| Provide a substrate, a plurality of light-emitting devices being provided on a side of the substrate at intervals from each other, the plurality of light-emitting devices include a plurality of groups of light-emitting devices, and each group of light-emitting devices including at least one light-emitting device | ~S100 |

↓

| Form a first light dimming layer on the side of the substrate by inkjet printing, the first light dimming layer including portions, every two adjacent groups of light-emitting devices being provided with a portion of the first light dimming layer, a gap existing between a portion of the first light dimming layer and at least one side face of light-emitting device(s) adjacent thereto, the first light dimming layer being configured to absorb at least a portion of light entering the first light dimming layer, and a material of the first light dimming layer including a flowable light-absorbing material | ~S200 |

↓

| Form a first fixing layer on a side of the plurality of light-emitting devices away from the substrate and on a side of the first light dimming layer away from the substrate, a portion of the first fixing layer being located in the gap, the first fixing layer being a light-transmitting film | ~S300 |

FIG. 24

Provide a substrate, a plurality of light-emitting devices being provided on a side of the substrate at intervals from each other, the plurality of light-emitting devices include a plurality of groups of light-emitting devices, and each group of light-emitting devices including at least one light-emitting device ~ S100

Form a fixing pattern on a side of every at least one light-emitting device away from the substrate by inkjet printing, the fixing pattern covering and surrounding the at least one light-emitting device, so as to fix the at least one light-emitting device, and a plurality of fixing patterns forming a second fixing layer ~ S150

Form a first light dimming layer on the side of the substrate by inkjet printing, the first light dimming layer including portions, every two adjacent groups of light-emitting devices being provided with a portion of the first light dimming layer, a gap existing between a portion of the first light dimming layer and at least one side face of light-emitting device(s) adjacent thereto, the first light dimming layer being configured to absorb at least a portion of light entering the first light dimming layer, and a material of the first light dimming layer including a flowable light-absorbing material ~ S200

Form a first fixing layer on a side of the plurality of light-emitting devices away from the substrate and on a side of the first light dimming layer away from the substrate by inkjet printing, a portion of the first fixing layer being located in the gap, the first fixing layer being a light-transmitting film ~ S300

FIG. 27

DISPLAY SUBSTRATE AND METHOD FOR MANUFACTURING THE SAME, AND DISPLAY APPARATUS

CROSS-REFERENCE TO RELATED APPLICATION

This application is a national phase entry under 35 USC 371 of International Patent Application No. PCT/CN2020/139715 filed on Dec. 26, 2020, which is incorporated herein by reference in its entirety.

TECHNICAL FIELD

The present disclosure relates to the field of display technologies, and in particular, to a display substrate and a method for manufacturing the same, and a display apparatus.

BACKGROUND

Due to advantages such as self-luminescence, high efficiency, high brightness, high reliability, high energy efficiency and quick response, mini light emitting diodes (Mini LEDs) and micro light emitting diodes (Micro LEDs) are applied to the fields of micro displays, medium-sized displays (such as mobile phones and televisions), and large-screen displays (such as cinema screens).

SUMMARY

In one aspect, a display substrate is provided. The display substrate includes a substrate, a plurality of light-emitting devices disposed on a side of the substrate, a first light dimming layer disposed on the side of the substrate, and a first fixing layer disposed on a side of the plurality of light-emitting devices and the first light dimming layer away from the substrate. The plurality of light-emitting devices are arranged at intervals from each other and divided into a plurality of groups light-emitting devices, and each group of light-emitting devices includes at least one light-emitting device. The first light dimming layer includes portions each located between two adjacent groups of light-emitting devices. A gap exists between a portion of the first light dimming layer and at least one side face of at least one light-emitting device adjacent thereto. A portion of the first fixing layer is located in the gap. The first fixing layer is a light-transmitting film.

In some embodiments, the first light dimming layer includes a plurality of light dimming sub-layers that are stacked. The plurality of light dimming sub-layers include a first light dimming sub-layer and a second light dimming sub-layer that are stacked in a direction parallel to a thickness direction of the substrate and moving away from the substrate. An orthographic projection of the first light dimming sub-layer on the substrate coincides with or is located within an orthographic projection of the second light dimming sub-layer on the substrate.

In some embodiments, relative to the substrate, a surface of the first light dimming layer away from the substrate is flush with or lower than surfaces of the light-emitting devices away from the substrate.

In some embodiments, relative to the substrate, the surface of the first light dimming layer away from the substrate is lower than the surfaces of the light-emitting devices away from the substrate, a ratio of a distance between the surface of the first light dimming layer away from the substrate and the substrate to a distance between the surfaces of the light-emitting devices away from the substrate and the substrate is greater than or equal to 4:5, and less than 1:1.

In some embodiments, a gap exists between the portion of the first light dimming layer and each side face of the at least one light-emitting device adjacent thereto.

In some embodiments, an outer boundary of an orthographic projection of the first light dimming layer on the substrate approximately coincides with an edge of the substrate. An angle between a surface of the first light dimming layer away from the substrate and a side face of the first light dimming layer corresponding to the edge of the substrate is approximately a right angle.

In some embodiments, in a thickness direction of the substrate, a portion of the first light dimming layer located between two adjacent light-emitting devices has a plurality of cross sections perpendicular to the thickness direction of the substrate. An orthographic projection of a cross section, other than a cross section closest to the substrate and a cross section farthest away from the substrate, on the substrate is located within an orthographic projection of the cross section closest to the substrate on the substrate.

In some embodiments, a shape of a section, taken along a plane parallel to the thickness direction of the substrate and a connection line of centers of the two adjacent light-emitting devices, of the portion of the first light dimming layer located between the two adjacent light-emitting devices includes a trapezoid or an approximate trapezoid.

In some embodiments, in a direction parallel to the thickness direction of the substrate and moving away from the substrate, areas of orthographic projections of the plurality of cross sections on the substrate decrease in order. A length of a bottom base of the trapezoid or the approximate trapezoid proximate to the substrate is greater than a length of a top base of the trapezoid or the approximate trapezoid away from the substrate.

In some embodiments, the shape of the section, taken along the plane parallel to the thickness direction of the substrate and the connection line of the centers of the two adjacent light-emitting devices, of the portion of the first light dimming layer located between the two adjacent light-emitting devices includes an approximate trapezoid, a top base of the approximate trapezoid away from the substrate smoothly transitions to a side edge of the approximate trapezoid located between the top base and the bottom base of the approximate trapezoid that is proximate to the substrate.

In some embodiments, each group of light-emitting devices includes one light-emitting device. The first light dimming layer is disposed between any two adjacent light-emitting devices.

In some embodiments, the display substrate further includes a second fixing layer. The second fixing layer is a light-transmitting layer, and includes a plurality of fixing patterns that are arranged at intervals from each other. A fixing pattern surrounds a group of light-emitting devices to fix the group of light-emitting devices. A portion of the first light dimming layer is located in a gap between any two adjacent fixing patterns of the plurality of fixing patterns, and is in contact with the two adjacent fixing patterns. The first fixing layer is located on a side of the second fixing layer and the first light dimming layer away from the substrate.

In some embodiments, a shape of a section, taken along a plane parallel to a thickness direction of the substrate and a connection line of centers of two adjacent light-emitting devices, of the portion of the first light dimming layer located between the two adjacent groups of light-emitting devices includes a trapezoid or an approximate trapezoid. A length of a bottom base of the trapezoid or approximate trapezoid proximate to the substrate is less than a length of a top base of the trapezoid or approximate trapezoid away from the substrate.

In some embodiments, the group of light-emitting devices surrounded by the fixing pattern includes at least two light-emitting devices, and the fixing pattern fixes the at least two light-emitting devices. A light-emitting device of the at least two light-emitting devices is configured to emit light of a single color. Light emitted by all of the at least two light-emitting devices is of at least one color.

In some embodiments, the display substrate further includes a plurality of light-transmitting particles disposed on a side of the first fixing layer away from the substrate. The plurality of light-transmitting particles are configured to change a propagation direction of at least a portion of light entering the plurality of light-transmitting particles.

In some embodiments, the plurality of light-transmitting particles are arranged in an array. A distance between any two adjacent light-transmitting particles is in a range of 95 μm to 105 μm, inclusive. A thickness of each light-transmitting particle is in a range of 6 μm to 12 μm, inclusive. A dimension of an orthographic projection of each light-transmitting particle on the substrate is in a range of 45 μm to 55 μm, inclusive. And/or, a shape of surfaces of the plurality of light-transmitting particles includes at least one of a pyramid, a wedge, an arc surface and a spherical surface.

In some embodiments, the display substrate further includes a plurality of functional devices. At least one functional device is disposed on a same side of the substrate as the plurality of light-emitting devices. The at least one functional device is configured to provide control signals for the plurality of light-emitting devices.

In some embodiments, relative to the substrate, a surface of the first fixing layer away from the substrate is higher than a surface of the at least one functional device away from the substrate.

In some embodiments, the plurality of functional devices include a plurality of driving chips. The plurality of driving chips are located on a same side of the substrate as the plurality of light-emitting devices. A driving chip is electrically connected to a group of light-emitting devices. The driving chip is configured to provide control signals for the group of light-emitting devices. The display substrate further includes a second light dimming layer disposed on surfaces of the plurality of driving chips away from the substrate. The second light dimming layer is configured to reduce reflection of light incident on the surfaces of the plurality of driving chips by the plurality of driving chips.

In some embodiments, a material of the second light dimming layer is same as a material of the first light dimming layer; or a material of the second light dimming layer is same as a material of the first fixing layer.

In some embodiments, the display substrate further includes a light reflection layer disposed on a side face of each light-emitting device. The light reflection layer is configured to reflect light emitted by the light-emitting device and incident on the light reflection layer.

In some embodiments, relative to the substrate, a surface of the first light dimming layer away from the substrate is higher than surfaces of the light-emitting devices away from the substrate. And/or a ratio of a distance between a surface of the first light dimming layer away from the substrate and the substrate to a dimension of the light-emitting device in a direction perpendicular to a thickness direction of the substrate is greater than or equal to 1:1, and less than or equal to $\sqrt{3}:1$.

In another aspect, a method for manufacturing a display substrate is provided. The method includes: providing a substrate, providing a plurality of light-emitting devices on a side of the substrate at intervals from each other, the plurality of light-emitting devices being divided into a plurality of groups of light-emitting devices, and each group of light-emitting devices including at least one light-emitting device; forming a first light dimming layer on the side of the substrate by inkjet printing, the first light dimming layer including portions each located between two adjacent groups of light-emitting devices, a gap existing between a portion of the first light dimming layer and at least one side face of at least one light-emitting device adjacent thereto; and forming a first fixing layer on a side of the plurality of light-emitting devices away from the substrate and the first light dimming layer away from the substrate, a portion of the first fixing layer being located in the gap, and the first fixing layer being a light-transmitting film.

In some embodiments, forming the first light dimming layer on the side of the substrate by inkjet printing includes: forming a plurality of light dimming sub-layers on the side of the substrate by inkjet printing in sequence, the plurality of light dimming sub-layers being stacked to form the first light dimming layer. Forming the plurality of light dimming sub-layers on the side of the substrate by inkjet printing in sequence includes: forming a first light dimming sub-layer on the side of the substrate by inkjet printing, the first light dimming sub-layer including portions each located between two adjacent groups of light-emitting devices, a gap existing between a portion of the first light dimming sub-layer and light-emitting devices adjacent thereto; and forming a second light dimming sub-layer on a surface of the first light dimming sub-layer away from the substrate by inkjet printing, the second light dimming sub-layer covering the first light dimming sub-layer, and a gap existing between a portion of the second light dimming sub-layer and at least one side face of the at least one light-emitting device adjacent thereto.

In some embodiments, forming the first light dimming layer on the side of the substrate by inkjet printing includes: forming a barrier wall on an edge of the substrate by inkjet printing, an orthographic projection of the barrier wall on the substrate being annular, and a thickness of the barrier wall being approximately equal to a distance between surfaces of the plurality of light-emitting devices away from the substrate and the substrate; and forming a filling portion inside the barrier wall, the filling portion and the barrier wall forming the first light dimming layer, an angle between a surface of the first light dimming layer away from the substrate and a side face of the first light dimming layer corresponding to the edge of the substrate being approximately a right angle.

In some embodiments, before forming the first light dimming layer on the side of the substrate by inkjet printing, the method further includes: forming a fixing pattern on a side of each group of light-emitting devices away from the substrate by inkjet printing, the fixing pattern surrounding a group of light-emitting devices to fix the group of light-emitting devices, and a plurality of fixing patterns forming a second fixing layer.

In still another aspect, a display apparatus is provided. The display apparatus includes the display substrate as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, and an actual process of a method involved in the embodiments of the present disclosure.

FIG. 23 is a partial structural diagram of a display substrate, in accordance with some embodiments of the present disclosure;

FIG. 24 is a flowchart of a method for manufacturing a display substrate, in accordance with some embodiments of the present disclosure;

FIG. 27 is a flowchart of another method for manufacturing a display substrate, in accordance with some embodiments of the present disclosure;

DETAILED DESCRIPTION

Figure 1:
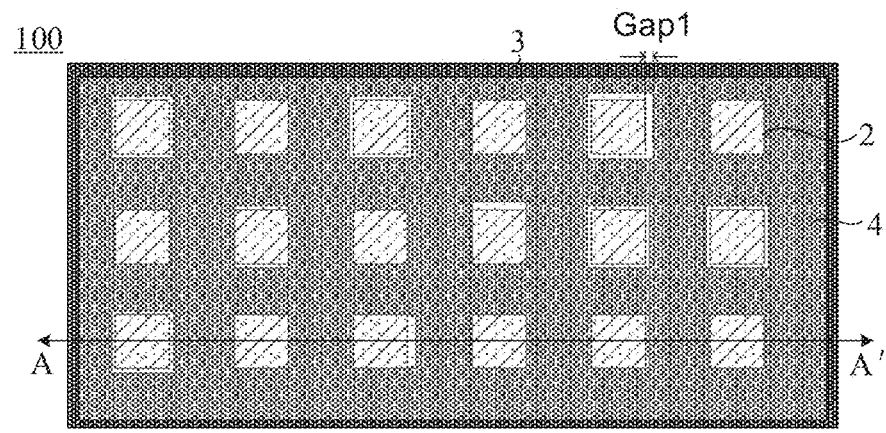
FIG. 1 is a top view of a display substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical contact or electrical contact with each other.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

In addition, the phrase "based on" as used herein is meant to be open and inclusive, since a process, step, calculation or other action that is "based on" one or more of the stated conditions or values may, in practice, be based on additional conditions or values exceeding those stated.

As used herein, terms such as "about" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Therefore, variations in shape with respect to the drawings due to, for example, manufacturing technologies and/or tolerances may be envisaged. The exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in an apparatus, and are not intended to limit the scope of the exemplary embodiments.

In the related art, Mini LEDs or Micro LEDs can emit light of various colors, such as red, green, blue or white. In a case where a plurality of Mini LEDs or a plurality of Micro LEDs are applied to a display substrate, the Mini LEDs or Micro LEDs may be arranged in sub-pixel regions of the display substrate, and may be each directly used as a part of a sub-pixel for display.

Here, the description is made by taking an example where pluralities of Mini LEDs are used in the display substrate. In the related art, a black material is usually disposed between the plurality of Mini LEDs, so as to use the black material to improve the contrast of the display substrate.

In one implementation, black adhesive is usually filled in gaps between the plurality of Mini LEDs, and applied on upper surfaces of the plurality of Mini LEDs by a coating process, so that the black adhesive is in contact with the side faces and the upper surfaces of each Mini LED. In this way, the black adhesive may improve the contrast of the display substrate and fix the Mini LEDs. However, after the black adhesive is formed by the coating process, a surface of the black adhesive needs to be ground by an additional grinding process to reduce a thickness of the black adhesive. Since the black adhesive is usually silica gel doped with black particles, the black particles are easily disintegrated from the silica gel during grinding of the black adhesive, resulting in an uneven surface and poor uniformity of the black adhesive after grinding.

In another implementation, the black adhesive is usually provided onto a film (for example, polyethylene terephthalate, PET for short) to form a black film; then, the black film is provided to be opposite to the plurality of Mini LEDs of the display substrate, and the black film is pressed onto the display substrate by a pressing process, so that the plurality of Mini LEDs stick into and come into contact with the black adhesive. However, an area of the black film is greater than an area of the display substrate, and after the black film is pressed onto the display substrate, a portion of the black film beyond an edge of the display substrate needs to be removed by a laser process. Consequently, an edge of a remaining portion of the black film will appear white due to damage, resulting in a poor splicing effect of a substrate that are formed by splicing a plurality of display substrates together.

Figure 22:
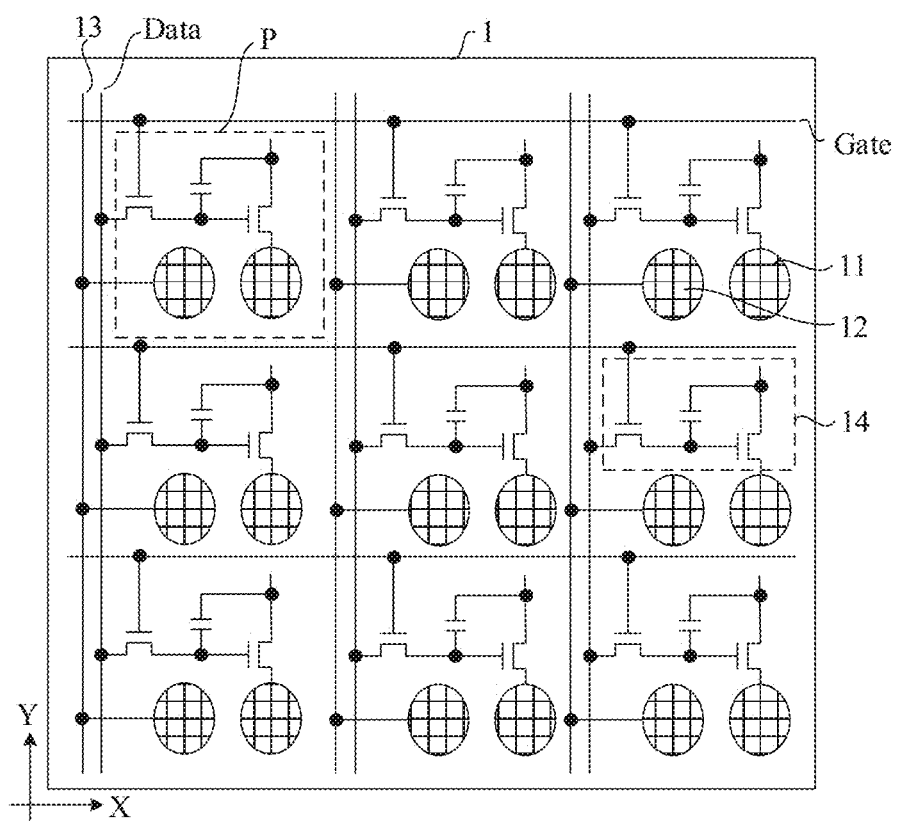
FIG. 22 is a schematic diagram of another display substrate, in accordance with some embodiments of the present disclosure.

On this basis, some embodiments of the present disclosure provide a display substrate. As shown in FIG. 22, the display substrate 100 has a plurality of sub-pixel regions P. The plurality of sub-pixel regions P may be arranged, for example, in an array.

In some examples, as shown in FIGS. 2 to 12 and 14 to 16, the display substrate 100 includes a substrate 1.

Herein, the substrate 1 may be of various types, which may be determined according to actual needs.

For example, the substrate 1 is a rigid substrate. The rigid substrate is, for example, a glass substrate or a polymethyl methacrylate (PMMA) substrate.

For another example, the substrate 1 is a flexible substrate. The flexible substrate is, for example, a polyethylene terephthalate (PET) substrate, a polyethylene naphthalate two formic acid glycol ester (PEN) substrate, or a polyimide (PI) substrate.

In some examples, as shown in FIGS. 1, 2, 6, 8 and 12, the display substrate 100 further includes a plurality of light-emitting devices 2 disposed on a side of the substrate 1. The plurality of light-emitting devices 2 are arranged at intervals from each other. That is, a gap Gap1 exists between any two adjacent light-emitting devices 2.

The plurality of light-emitting devices 2 may be arranged in various ways, which may be determined according to actual needs.

For example, a sub-pixel region P may be provided with one light-emitting device 2. In this case, the light-emitting device 2 may be used for display of a sub-pixel in the corresponding sub-pixel region P.

For another example, a sub-pixel region P may be provided with light-emitting devices 2. In this case, the light-emitting devices 2 may be together used for display of sub-pixels in the corresponding sub-pixel region P. In this case, during a display process, it may be possible that only some light-emitting devices 2 in the light-emitting devices 2 in the sub-pixel region P are used for display, and when a certain light-emitting device 2 in the some light-emitting devices 2 is abnormal, another light-emitting device 2 in the some light-emitting devices 2 may be used for display instead of the certain light-emitting device 2.

For example, the plurality of light-emitting devices 2 may be divided into a plurality of groups of light-emitting devices 2, and each group of light-emitting devices 2 may include at least one light-emitting device 2.

For example, each group of light-emitting devices 2 may include one light-emitting device. For another example, each group of light-emitting devices 2 may include two light-emitting devices 2. For still another example, each group of light-emitting devices 2 may include three light-emitting devices 2.

In a case where a sub-pixel region P is provided with one light-emitting device 2, a group of light-emitting devices 2 may, for example, correspond to one, two or more sub-pixel regions P.

In a case where a sub-pixel region P is provided with a plurality of light-emitting devices 2, a group of light-emitting devices 2 may, for example, correspond to one sub-pixel region P.

In some examples, as shown in FIGS. 1 to 16, the display substrate 100 may further include a first light dimming layer 3 disposed on the side of the substrate 1. The first light dimming layer 3 include portions each between two adjacent groups of light-emitting devices 2.

Each group of light-emitting devices 2 includes at least one light-emitting device 2. That is, each group of light-emitting devices 2 may include one light-emitting device 2 or at least two light-emitting devices 2.

Here, an arrangement of the first light dimming layer 3 is related to the number of light-emitting devices 2 included in each group of light-emitting devices 2, and may be determined according to actual needs.

For example, as shown in FIG. 1, each group of light-emitting devices 2 includes one light-emitting device 2. Every two adjacent groups of light-emitting devices 2 are provided with a portion of the first light dimming layer 3 therebetween, that is, any two adjacent light-emitting devices 2 are provided with a portion of the first light dimming layer 3 therebetween. The first light dimming layer 3 may be in a shape of a grid, and each square in the grid is provided with one light-emitting device 2.

For example, each group of light-emitting devices 2 may include at least two light-emitting devices 2. Every two adjacent groups of light-emitting devices 2 are provided with a portion of the first light dimming layer 3 therebetween, that is, every two adjacent light-emitting devices 2 in some of the light-emitting devices 2 are provided with a portion of the first light dimming layer 3 therebetween. The first light dimming layer 3 may be in the shape of a grid, and each square in the grid is provided with a group of light-emitting devices 2 (i.e., at least two light-emitting devices 2).

FIGS. 13 to 16 illustrate examples where a group of light-emitting devices 2 includes three light-emitting devices 2. The three light-emitting devices 2 are arranged, for example, in a manner shown in FIG. 13. That is, in a group of light-emitting devices 2, every two adjacent light-emitting devices 2 are not provided with a portion of the light dimming layer 3.

In some examples, as shown in FIGS. 1, 2, 6, 8 and 12, a gap Gap1 exists between a portion of the first light dimming layer 3 and at least one side face of light-emitting device(s) 2 adjacent thereto.

Here, the "light-emitting device(s) 2 adjacent thereto" refers to at least one light-emitting device 2 of all light-emitting devices 2 adjacent to the portion of the first light dimming layer 3. The "at least one side face" refers to at least one side face of a light-emitting device 2 of the at least one light-emitting device 2 adjacent to the portion of the first light dimming layer 3. The "side face" refers to a surface of surfaces of the light-emitting device 2 that is parallel to or approximately parallel to a thickness direction of the substrate 1.

For example, a portion of the first light dimming layer 3 is disposed adjacent to a plurality of light-emitting devices 2; there is a gap between one side face of a single light-emitting device 2 of the plurality of light-emitting devices 2 and the portion of the first light dimming layer 3, and other side faces of the single light-emitting device 2 are in contact with the portion of the first light dimming layer 3. All side faces of light-emitting devices 2 in the plurality of light-emitting devices 2 other than the single light-emitting device 2 are all in contact with the portion of the first light dimming layer 3.

In some examples, a gap exists between the portion of the first light dimming layer and each side face of the at least one light-emitting device 2 adjacent thereto.

For example, a portion of the first light dimming layer 3 is disposed adjacent to a plurality of light-emitting devices 2, and there is a gap between the portion of the first light dimming layer 3 and each side face of a single light-emitting device 2 of the plurality of light-emitting devices 2. That is, the portion of the first light dimming layer 3 is not in contact with the single light-emitting device 2.

For another example, a portion of the first light dimming layer 3 is disposed adjacent to a plurality of light-emitting devices 2, and there is a gap between the portion of the first light dimming layer 3 and each side face of at least two light-emitting devices 2 of the plurality of light-emitting devices 2. That is, the portion of the first light dimming layer 3 is not in contact with either of the at least two light-emitting devices 2.

In some examples, the first light dimming layer 3 is formed by curing a flowable light-absorbing material. The first light dimming layer 3 is configured to absorb at least a portion of light entering the first light dimming layer 3.

Here, the light entering the light dimming layer 3 may include natural light entering the light dimming layer 3 from the outside, and/or light emitted by the light-emitting devices 2.

For example, the substrate 1 will reflect natural light incident on a surface of the substrate 1. In a case where the substrate 1 is provided with the first light dimming layer 3, the first light dimming layer 3 may be used to absorb at least a portion of the natural light incident on the substrate 1, so as to reduce the reflection of the natural light by the substrate 1. In this way, during the display process of the display substrate 100, the first light dimming layer 3 may be used to reduce an amount of natural light incident on the display substrate 100 from the outside and reflected by the substrate 1. As a result, in a case where a display state of the display substrate 100 is a dark state (that is, the light-emitting devices 2 do not emit light), a display surface of the display substrate 100 may be in a darker state, and a contrast of the display substrate 100 may be effectively improved.

For example, propagation directions of the light emitted by the light-emitting devices 2 are basically arbitrary. In a case where a portion of the first light dimming layer 3 is disposed between two adjacent groups of light-emitting devices 2, the portion of the first light dimming layer 3 may be used to absorb at least a portion of the light emitted by the light-emitting devices 2 and entering the portion of the first light dimming layer 3. In this way, during the display process of the display substrate 100, a light mixing problem may be ameliorated or even eliminated through the first light dimming layer 3, and a display effect of the display substrate 100 may be improved.

It will be noted that, the flowable light-absorbing material refers to a light-absorbing material having the properties of fluids. After the flowable light-absorbing material drops onto a surface with protrusions and depressions to form a film, the film may flow from the protrusions to the depressions, and regardless of shapes of the depressions, due to an existence of the surface tension of liquids, a surface of the film away from the protrusions and depressions is substantially maintained as a relatively flat surface with no unevenness.

The word "curing" refers to a process of converting a film into a solid state and keeping the film in the solid state after the film formed from a flowable light-absorbing material flows for a certain period of time.

The first light dimming layer 3 is formed by curing the flowable light-absorbing material. That is, a surface of the first light dimming layer 3 away from the substrate 1 is substantially a relatively flat surface with no unevenness and high uniformity. Moreover, there is no difference in appearance between an edge portion of the first light dimming layer 3 and a middle portion thereof. The surface of the first light dimming layer 3 away from the substrate 1 has a texture, for example, similar to baking varnish.

For example, a material of the first light dimming layer 3 may include a polyacetate resin. For example, the polyacetate resin may be doped with carbon powder, dye or the like, so as to darken a color of the first light dimming layer 3, and thus enable the first light dimming layer 3 to absorb the light incident on itself. The color of the first light dimming layer 3 includes but is not limited to black.

For example, the color of the first light dimming layer 3 may also be green or brown. The color of the first light dimming layer 3 may be determined according to actual needs, so as to achieve corresponding functions (for example, reflecting the light incident on itself).

In some examples, as shown in FIGS. 1 to 16, the display panel 100 further includes a first fixing layer 4 disposed on a side of the plurality of light-emitting devices 2 and the first light dimming layer 3 away from the substrate 1.

In some examples, the first fixing layer 4 is a light-transmitting film. That is, the first fixing layer 4 may have a good light transmittance. In this way, it may be possible to reduce or avoid loss of light passing through the first fixing layer 4, and thus achieve a high light extraction efficiency during a process in which the light-emitting devices emit light to enable the display substrate 100 to perform display.

For example, a light transmittance of the first fixing layer 4 may in a range of 96% to 98%. For example, the light transmittance is 96%, 96.5%, 97%, 97.9% or 98%.

For example, relative to the substrate 1, a surface of the first fixing layer 4 away from the substrate 1 is higher than surfaces of the plurality of light-emitting devices 2 away from the substrate 1.

In this way, the first fixing layer 4 may cover the plurality of light-emitting devices 2, so that orthographic projections of the plurality of light-emitting devices 2 on the substrate 1 may be located within an orthographic projection of the first fixing layer 4 on the substrate 1. Therefore, it may be possible to prevent the surfaces of the plurality of light-emitting devices 2 away from the substrate 1 from being exposed, and thus protect the surfaces of the plurality of light-emitting devices 2 away from the substrate 1 and avoid damage to the plurality of light-emitting devices 2.

For example, the first fixing layer 4 covers at least a portion of the first light dimming layer 3. An outer boundary of an orthographic projection of the first light dimming layer 3 on the substrate 1 may partially overlap with a boundary of the orthographic projection of the first fixing layer 4 on the substrate 1. Or, the orthographic projection of the first light dimming layer 3 on the substrate 1 is located within the orthographic projection of the first fixing layer 4 on the substrate 1. Or, the orthographic projection of the first fixing layer 4 on the substrate 1 is located within the orthographic projection of the first light dimming layer 3 on the substrate 1.

In some examples, the first fixing layer 4 is formed by curing a flowable light-transmitting material. That is, the surface of the first fixing layer 4 away from the substrate 1 is substantially a relatively flat surface with no unevenness and high uniformity. Moreover, there is no difference in appearance between an edge portion of the first fixing layer 4 and a middle portion thereof. The surface of the first fixing layer 4 away from the substrate 1 has a texture, for example, similar to baking varnish.

For example, a material of the first fixing layer 4 may include polyacetate resin. For example, the polyacetate resin may be doped with, but not limited to, titanium dioxide or diffusion powder.

In some examples, the first fixing layer 4 is configured to fix the plurality of light-emitting devices 2 and the first light dimming layer 3.

Here, there is a certain bonding force (for example, an adhesive force) between the first light dimming layer 3 and the substrate 1, so that the first light dimming layer 3 may be firmly fixed on the substrate 1. The first fixing layer 4 is located on a side of the plurality of light-emitting devices 2 and the first light dimming layer 3 away from the substrate 1, so that not only there is a certain bonding force between the first fixing layer 4 and the plurality of light-emitting devices 2, but also there is a certain bonding force between the first fixing layer 4 and the first light dimming layer 3. Since the first fixing layer 4 is a planar film, the first fixing layer 4 may fix the plurality of light-emitting devices 2 through the first light dimming layer 3, and may fix the first light dimming layer 3 through the plurality of light-emitting devices 2.

In some examples, as shown in FIGS. 2 to 6, 8 and 12, a portion 41 of the first fixing layer 4 is located in a gap Gap1 between a portion 41 of the first light dimming layer 3 and light-emitting devices 2 adjacent thereto.

Since the first fixing layer 4 is formed by curing the flowable light-transmitting material, in a case where there is a gap between a portion of the first light dimming layer 3 and light-emitting devices 2 adjacent thereto, before being cured, the flowable light-transmitting material may flow into the gap between the portion of the first light dimming layer 3 and the light-emitting devices 2 adjacent thereto to fill the gap. As a result, a portion of the first fixing layer 4 to be formed by curing is located in the gap.

In this way, it may be possible to increase a contact area between the first fixing layer 4 and the light-emitting devices 2 and a contact area between the first fixing layer 4 and the first light dimming layer 3, increase the bonding force between the first fixing layer 4 and the light-emitting devices 2 and the bonding force between the first fixing layer 4 and the first light dimming layer 3, and thereby increase a fixing effect of the first fixing layer 4 on the light-emitting devices 2 and the first light dimming layer 3.

Therefore, in the display substrate 100 provided in some embodiments of the present disclosure, by providing a portion of the first light dimming layer 3 between two adjacent groups of light-emitting devices 2 and forming the first fixing layer 4 on the side of the light-emitting devices 2 and the first light dimming layer 3 away from the substrate 1, in a first aspect, it may be possible to use the first light dimming layer 3 to absorb the natural light incident on the first light dimming layer 3 from the outside, and thus improve the contrast of the display substrate 100; in a second aspect, it may also be possible to use the first light dimming layer 3 to absorb the light emitted from the light-emitting devices 2 and incident on the first light dimming layer 3, and thus ameliorate or even eliminate the light mixing problem and improve the display effect of the display substrate 100; in a third aspect, it may be possible to use the first fixing layer 4 to fix the light-emitting devices 2 and the first light dimming layer 3, and thus prevent the light-emitting devices 2 from falling off.

Moreover, by using the flowable light-absorbing material and the flowable light-transmitting material to form the first light dimming layer 3 and the first fixing layer 4 through curing respectively, it may not only be possible to improve a fixing effect of the first fixing layer 4 on the light-emitting devices 2 and the first dimming layer 3, and it may also be possible to make both the surface of the first light dimming layer 3 away from the substrate 1 and the surface of the first fixing layer 4 away from the substrate 1 to be relatively flat, and ensure that there is no apparent difference between respective edge portions and middle portions of the surfaces of the two surfaces. In this way, it may be possible to improve the uniformity of both the surface of the first light dimming layer 3 away from the substrate 1 and the surface of the first fixing layer 4 away from the substrate 1, and improve a splicing effect of a substrate formed by splicing a plurality of display substrates 100 together.

Figure 3:
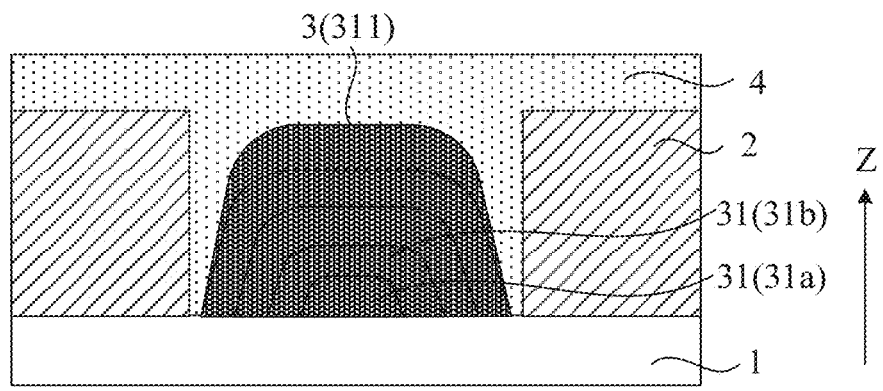
FIG. 3 is a partial schematic diagram of the sectional view shown in FIG. 2.

In some embodiments, as shown in FIG. 3, the first light dimming layer 3 includes a plurality of light dimming sub-layers 31 that are stacked.

In a process of forming the first light dimming layer 3, one light dimming sub-layer 31 may be formed in a single corresponding manufacturing process; and then, after a plurality of corresponding manufacturing processes performed in sequence, the first light dimming layer 3 including the plurality of light dimming sub-layers 31 may be obtained. Based on this, the first light dimming layer 3 is not formed in a single manufacturing process, and a structure of the first light dimming layer 3 is not an indivisible integrated structure. In this way, the uniformity of the surface of the first light dimming layer 3 away from the substrate 1 may be further improved.

In some examples, as shown in FIG. 3, the plurality of light dimming sub-layers 31 may include a first light dimming sub-layer 31a and a second light dimming sub-layer 31b that are stacked in a direction Z parallel to the thickness direction of the substrate 1 and moving away from the substrate 1.

For example, an orthographic projection of the first light dimming sub-layer 31a on the substrate 1 coincides with an orthographic projection of the second light dimming sub-layer 31b on the substrate 1. That is, an area of the orthographic projection of the first light dimming sub-layer 31a on the substrate 1 is equal to an area of the orthographic projection of the second light dimming sub-layer 31b on the substrate 1, and the second light dimming sub-layer 31b may cover a surface of the first light dimming sub-layer 31a away from the substrate 1.

For example, as shown in FIG. 3, the orthographic projection of the first light dimming sub-layer 31a on the substrate 1 is located within the orthographic projection of the second light dimming sub-layer 31b on the substrate 1. That is, the area of the orthographic projection of the first light dimming sub-layer 31a on the substrate 1 is less than the area of the orthographic projection of the second light dimming sub-layer 31b on the substrate 1; and the second light dimming sub-layer 31b may cover not only the surface of the first light dimming sub-layer 31a away from the substrate 1 but also side faces of the first light dimming sub-layer 31 facing light-emitting devices 2 adjacent thereto.

Here, it may be that no other light dimming sub-layers are provided between the first light dimming sub-layer 31a and the second light dimming sub-layer 31b. That is, the first light dimming sub-layer 31a is in direct contact with the second light dimming sub-layer 31b. Or, it may be that at least one light dimming sub-layer 31 is provided between the first light dimming sub-layer 31a and the second light dimming sub-layer 31b.

The first light dimming sub-layer 31a may be in contact with the substrate 1, and no other light dimming sub-layers 31 are provided between the first light dimming sub-layer 31a and the substrate 1. Or, it may be that at least one light dimming sub-layer 31 is provided between the first light dimming sub-layer 31a and the substrate 1.

In a case where the first light dimming sub-layer 31a is in contact with the substrate 1, the first light dimming sub-layer 31a may be formed in a first corresponding manufacturing process. The area of the orthographic projection of the first light dimming sub-layer 31a on the substrate 1 is relatively small. For example, there may be gaps between the first light dimming sub-layer 31 and all light-emitting devices 2 adjacent thereto. In this way, it may be possible to avoid an influence on the formation of the light dimming sub-layers 31 in a subsequent process.

A positional relationship between the first light dimming layer 3 and the light-emitting devices 2 is various, and may be determined according to actual needs.

Figure 9:
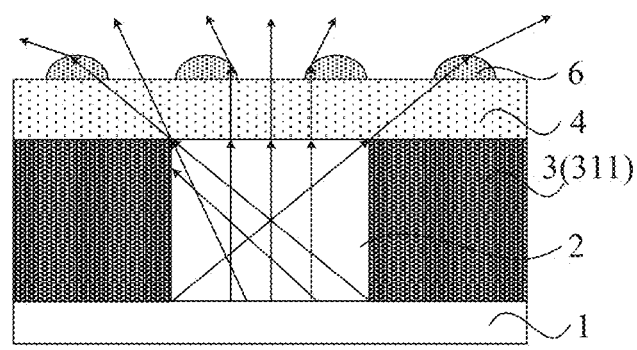
FIG. 9 is an optical path diagram of another display substrate, in accordance with some embodiments of the present disclosure.
Figure 14:
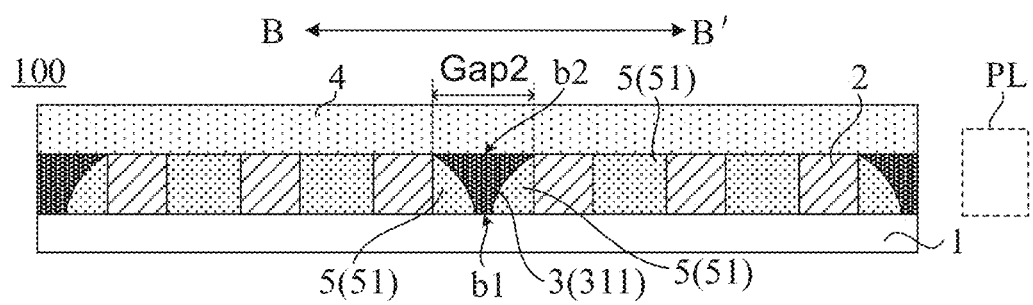
FIG. 14 is a sectional view of the display substrate shown in FIG. 13 taken along the line B-B'.
Figure 16:
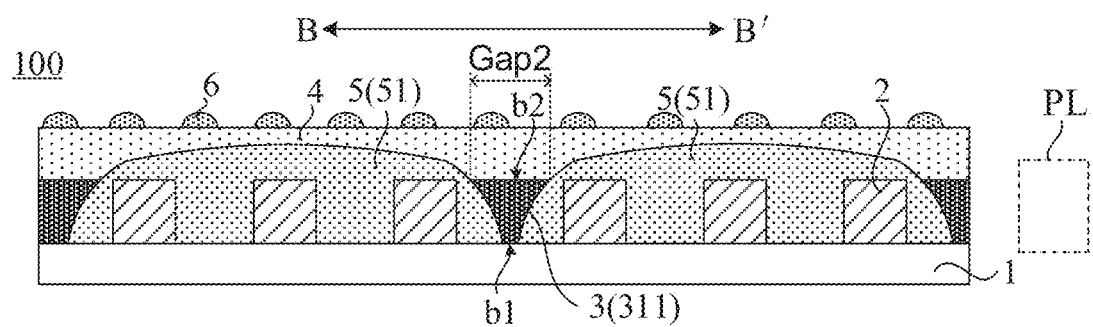
FIG. 16 is still another sectional view of the display substrate shown in FIG. 13 taken along the line B-B'.

In some examples, as shown in FIGS. 9, 14 and 16, relative to the substrate 1, the surface of the first light dimming layer 3 away from the substrate 1 is flush with surfaces of light-emitting devices 2 away from the substrate 1.

That is, the surface of the first light dimming layer 3 away from the substrate 1 and the surfaces of the light-emitting devices 2 away from the substrate 1 are located in a same plane, and a distance between the surface of the first light dimming layer 3 away from the substrate 1 and the substrate 1 is equal to a distance between the surfaces of the light-emitting devices 2 away from the substrate 1 and the substrate 1.

For example, considering an example where the distance between the surfaces of the light-emitting devices 2 away from the substrate 1 and the substrate 1 is 80 μm, the distance between the surface of the first light dimming layer 3 away from the substrate 1 and the substrate 1 may also be 80 μm.

Here, the light-emitting devices 2 may refer to all the light-emitting devices 2 included in the display substrate 100, or may refer to only a portion of all the light-emitting devices 2 included in the display substrate 100. The descriptions of the light-emitting devices 2 in the following two examples are the same, and details will not be repeated below.

Figure 2:
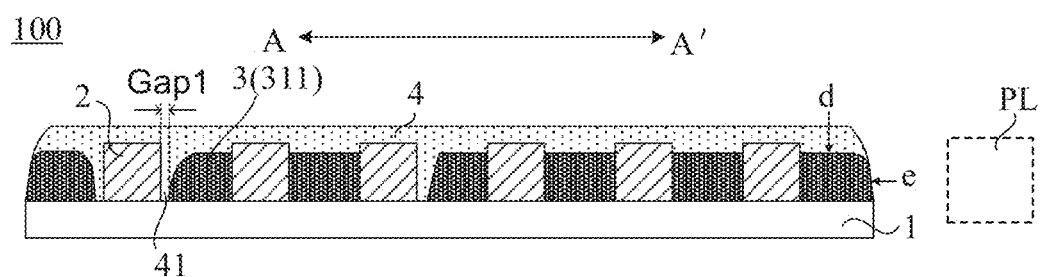
FIG. 2 is a sectional view of the display substrate shown in FIG. 1 taken along the line A-A'.
Figure 8:
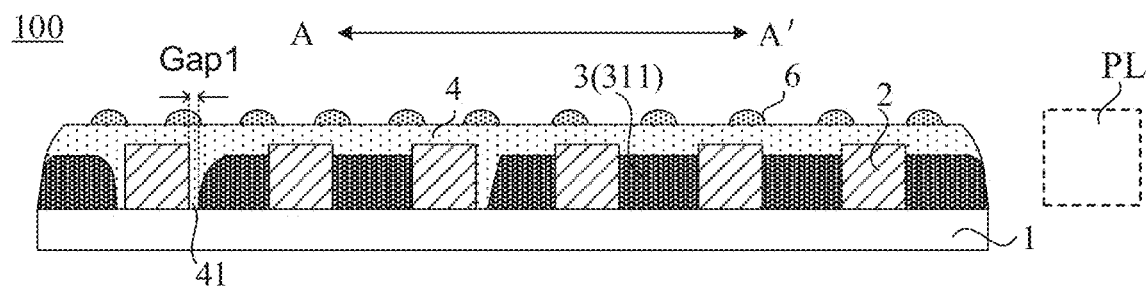
FIG. 8 is still another sectional view of the display substrate shown in FIG. 1 taken along the line A-A'.
Figure 12:
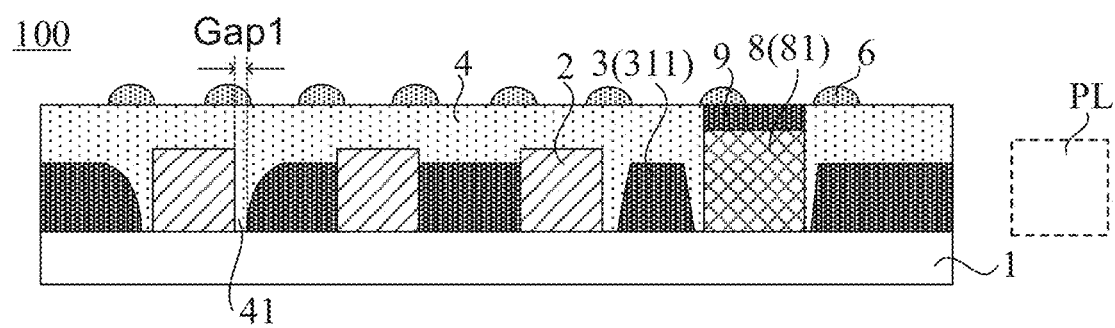
FIG. 12 is still another sectional view of the display substrate shown in FIG. 1 taken along the line A-A'.

In some other examples, as shown in FIGS. 2, 8 and 12, relative to the substrate 1, the surface of the first light dimming layer 3 away from the substrate 1 is lower than the surfaces of the light-emitting devices 2 away from the substrate 1.

In this case, a ratio of the distance between the surface of the first light dimming layer 3 away from the substrate 1 and the substrate 1 to the distance between the surfaces of the light-emitting devices 2 away from the substrate 1 and the substrate 1 may be greater than or equal to 4:5, and less than 1:1.

For example, considering an example where the distance between the surfaces of the light-emitting devices 2 away from the substrate 1 and the substrate 1 is 80 μm, the distance between the surface of the first light dimming layer 3 away from the substrate 1 and the substrate 1 may be greater than or equal to 64 μm (that is, 80% of the distance between the surfaces of the light-emitting devices 2 away from the substrate 1 and the substrate 1), and less than 80 μm. For example, the distance between the surface of the first light dimming layer 3 away from the substrate 1 and the substrate 1 may be 64 μm, 70 μm, 71 μm, 73 μm or 79.9 μm.

Figure 6:
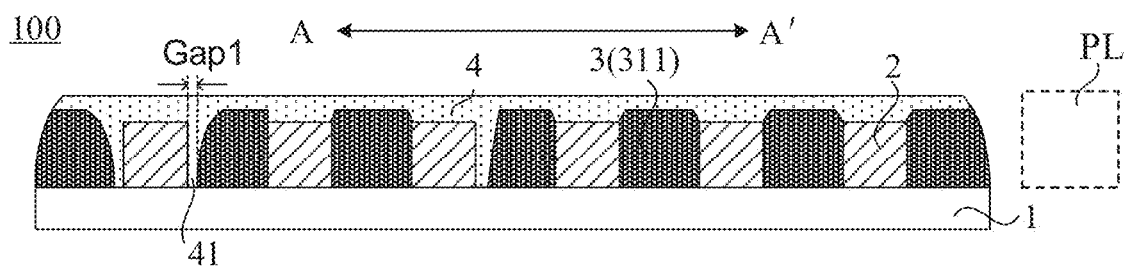
FIG. 6 is another sectional view of the display substrate shown in FIG. 1 taken along the line A-A'.
Figure 7:
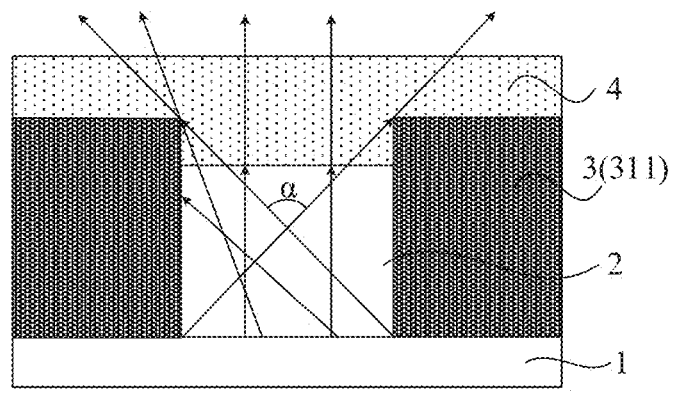
FIG. 7 is an optical path diagram of a display substrate, in accordance with some embodiments of the present disclosure.
Figure 10:
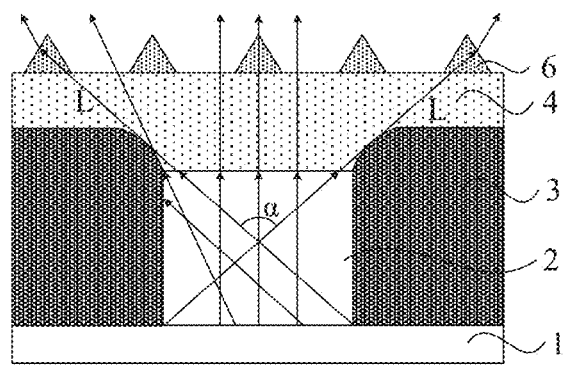
FIG. 10 is an optical path diagram of still another display substrate, in accordance with some embodiments of the present disclosure.

In still some other examples, as shown in FIGS. 6, 7 and 10, relative to the substrate 1, the surface of the first light dimming layer 3 away from the substrate 1 is higher than the surfaces of the light-emitting devices 2 away from the substrate 1.

As shown in FIG. 7, since the first light dimming layer 3 may absorb the light emitted by the light-emitting devices 2 and entering the first light dimming layer 3, in a case where, relative to the substrate 1, the surface of the first light dimming layer 3 away from the substrate 1 is higher than the surfaces of the light-emitting devices 2 away from the substrate 1, an exit angle of the light emitted by the light-emitting devices 2 may be reduced. Therefore, a viewing angle of the display substrate 100 may be narrowed, and an anti-peep function may be achieved.

In this case, a ratio of the distance between the surface of the first light dimming layer 3 away from the substrate 1 and the substrate 1 to a dimension of a light-emitting device 2 in a direction perpendicular to the thickness direction of the substrate 1 may be greater than or equal to 1:1, and less than or equal to $\sqrt{3}$:1.

In a case where the ratio of the distance between the surface of the first light dimming layer 3 away from the substrate 1 and the substrate 1 to the dimension of the light-emitting device 2 in the direction perpendicular to the thickness direction of the substrate 1 is equal to 1:1, the viewing angle of the display substrate 100 may be 90°. In a case where the ratio of the distance between the surface of the first light dimming layer 3 away from the substrate 1 and the substrate 1 to the dimension of the light-emitting device 2 in the direction perpendicular to the thickness direction of the substrate 1 is equal to $\sqrt{3}$:1, the viewing angle of the display substrate 100 may be 60°. That is, the viewing angle of the display substrate 100 may be in a range of 60° to 90°, inclusive.

For example, the dimension of the light-emitting device 2 in the direction perpendicular to the thickness direction of the substrate 1 may refer to any value in a range from a side length to a diagonal length of a shape of an orthographic projection of the light-emitting device 2 on the substrate 1.

Considering an example where of the orthographic projection of the light-emitting device 2 on the substrate 1 is in the shape of a square, a side length of the square is, for example, 100 μm, and a diagonal length of the square is, for example, $100\sqrt{2}$ μm, and thus the dimension of the light-emitting device 2 in the direction parallel to the substrate 1 may be in a range of 100 μm to $100\sqrt{2}$ μm, inclusive and the distance between the surface of the first light dimming layer 3 away from the substrate 1 and the substrate 1 may be in a range of 100 μm to 100 μm, inclusive.

Herein, the orthographic projection of the light-emitting device 2 on the substrate 1 may also be in other shapes, and the dimension of the shape may also be other values. The above examples of the present disclosure are only for briefly and clearly describing a relationship between the distance between the surface of the first light dimming layer 3 away from the substrate 1 and the substrate 1 and the dimension of the light-emitting device 2 in the direction perpendicular to the thickness direction of the substrate 1. However, the shape of the orthographic projection of the light-emitting device 2 on the substrate 1 and the dimension of the shape are not limited to the content of the above examples.

In some examples, as shown in FIG. 10, there may be a smooth transition between a side face, in contact with the light-emitting device 2, of a portion of the first light dimming layer 3 between two adjacent two light-emitting devices 2 and the surface of the portion of the first light dimming layer 3 away from the substrate 1. In this case, the viewing angle of the display substrate 100 is in a range of an angle α formed by lights L and tangents of a smooth transition portion of the first light dimming layer 3. Based on this, the ratio of the distance between the surface of the first light dimming layer 3 away from the substrate 1 and the substrate 1 to the dimension of the light-emitting device 2 in the direction perpendicular to the thickness direction of the substrate 1 may be greater than $\sqrt{3}$:1.

In some embodiments, as for a portion of the first fixing layer 4 opposite to a light-emitting device 2, a range of a distance between a surface thereof proximate to the light-emitting device 2 and a surface thereof away from the substrate 1 may be determined according to actual needs, as long as the light-emitting devices 2 and the first light dimming layer 3 are fixed by the first fixing layer 4, and a high light transmittance is achieved.

For example, as for the portion of the first fixing layer 4 opposite to the light-emitting devices 2, the distance between the surface thereof proximate to the light-emitting devices 2 and the surface thereof away from the substrate 1 may be in a range of 40 μm to 50 μm. For example, the distance may be 40 μm, 42 μm, 45 μm, 46.5 μm, or 50 μm.

Figure 4:
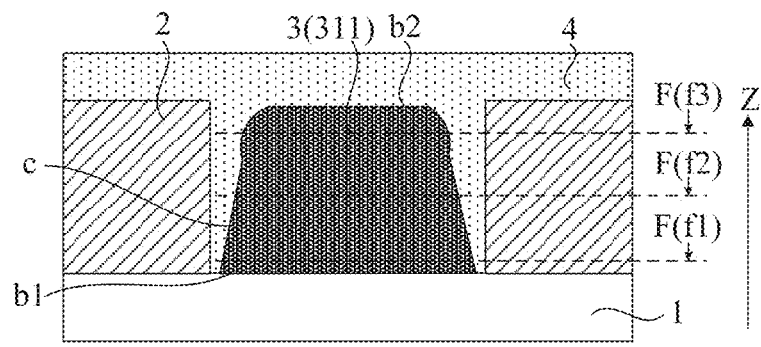
FIG. 4 is another partial schematic diagram of the sectional view shown in FIG. 2.

In some embodiments, as shown in FIG. 4, in the thickness direction of the substrate 1, a portion of the first light dimming layer 3 located between two light-emitting devices 2 adjacent thereto has a plurality of cross sections F perpendicular to the thickness direction of the substrate 1. An orthographic projection of a cross section F, other than a cross section F closest to the substrate 1 and a cross section F farthest away from the substrate 1, on the substrate 1 is located within an orthographic projection of the cross section F closest to the substrate 1 on the substrate.

In some examples, the cross section F of the portion of the first light dimming layer 3 closest to the substrate 1 may refer to a surface of the portion of the first light dimming layer 3 proximate to the substrate 1. The cross section F of the portion of the first light dimming layer 3 farthest away from the substrate 1 may refer to the surface of the portion of the first light dimming layer 3 away from the substrate 1. The cross section F other than the cross section F closest to the substrate 1 and the cross section F farthest away from the substrate 1 may refer to any one of the plurality of cross sections F located between the cross section F closest to the substrate 1 and the cross section F farthest away from the substrate 1.

For example, the orthographic projection of the cross section F, other than the cross section F closest to the substrate 1 and the cross section F farthest away from the substrate 1, on the substrate 1 is located within the orthographic projection of the cross section F closest to the substrate 1 on the substrate 1. That is, an area of the orthographic projection of the cross section F (i.e., the cross section F other than the cross section F closest to the substrate 1 and the cross section F farthest away from the substrate 1) on the substrate 1 is less than an area of the orthographic projection of the cross section F closest to the substrate 1 on the substrate 1; a perimeter of an outer boundary of the orthographic projection of the cross section F on the substrate 1 is less than a perimeter of an outer boundary of the orthographic projection of the cross section F closest to the substrate 1 on the substrate 1; and the outer boundary of the orthographic projection of the cross section F on the substrate 1 does not overlap with or partially overlaps with the outer boundary of the orthographic projection of the cross section F closest to the substrate 1 on the substrate 1. A figure formed by the cross section F and the cross section F closest to the substrate 1 is a figure with a narrow end (corresponding to the cross section F) and a wide end (corresponding to the cross section F closest to the substrate 1) that is opposite to the narrow end.

A relationship between the orthographic projection of the cross section F and the orthographic projection of the cross section F farthest away from the substrate 1 may vary.

For example, an orthographic projection of the cross section F farthest away from the substrate 1 on the substrate 1 coincides with the orthographic projection of the cross section F on the substrate 1. Or, the orthographic projection of the cross section F farthest away from the substrate 1 on the substrate 1 is located within the orthographic projection of the cross section F on the substrate 1. In this case, areas of orthographic projections of the plurality of cross sections F on the substrate 1 may decrease gradually (but not one by one) in the direction Z parallel to a thickness direction of the substrate 1 and moving away from the substrate 1.

For example, the orthographic projection of the cross section F on the substrate 1 is located within the orthographic projection of the cross section F farthest away from the substrate 1 on the substrate 1. Due to unavoidable factors of a manufacturing process or special designs, an area of the orthographic projection of the cross section F farthest away from the substrate 1 on the substrate 1 may be greater than the area of the orthographic projection of the cross section F on the substrate 1.

Figure 5:
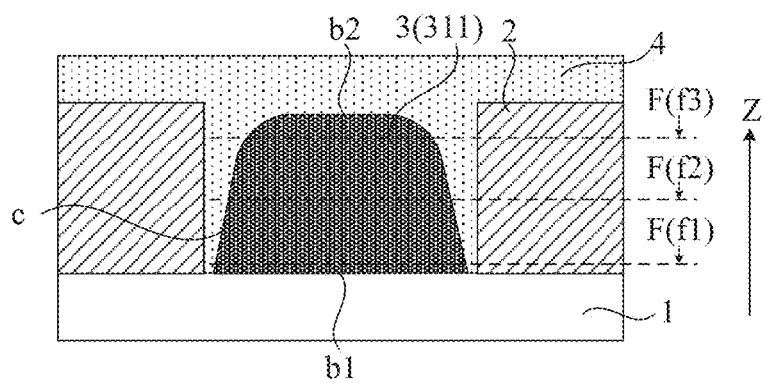
FIG. 5 is still another partial schematic diagram of the sectional view shown in FIG. 2.

FIGS. 4 and 5 illustrate examples where the portion of the first light dimming layer 3 located between the two adjacent light-emitting devices 2 has three cross sections F perpendicular to the thickness direction of the substrate 1. In the direction Z parallel to a thickness direction of the substrate 1 and moving away from the substrate 1, the three cross sections F perpendicular to the thickness direction of the substrate 1 are a first cross section f1, a second cross section f2 and a third cross section f3. The first cross section f1 is the cross section F closest to the substrate 1, and the third cross section f3 is the cross section F farthest away from the substrate 1.

For example, an orthographic projection of the second cross section f2 on the substrate 1 is located within an orthographic projection of the first cross section f1 on the substrate 1. A boundary of the orthographic projection of the second cross section f2 on the substrate 1 does not overlap with or partially overlaps with a boundary of the orthographic projection of the first cross section f1 on the substrate 1. An area of the orthographic projection of the second cross section f2 on the substrate 1 is less than an area of the orthographic projection of the first cross section f1 on the substrate 1.

For example, an orthographic projection of the third cross section f3 on the substrate 1 is located within the orthographic projection of the second cross section f2 on the substrate 1; or, the orthographic projection of the third cross section f3 on the substrate 1 coincides with the orthographic projection of the second cross section f2 on the substrate 1. An area of the orthographic projection of the third cross section f3 on the substrate 1 is less than or equal to the area of the orthographic projection of the second cross section f2 on the substrate 1. Alternatively, the area of the orthographic projection of the third cross section f3 on the substrate 1 may be greater than the area of the orthographic projection of the second cross section f2 on the substrate 1.

In some embodiments, as shown in FIGS. 2 to 6, 8 and 12, a shape of a section, taken along a plane PL parallel to the thickness direction of the substrate 1 and a connection line of centers of the two adjacent light-emitting devices 2, of the portion of the first light dimming layer 3 located between the two adjacent light-emitting devices 2 may vary.

In some examples, as shown in FIGS. 2, 8 and 12, the shape of the section may be, for example, a rectangle (i.e., a rectangle or a square).

That is, during the process of manufacturing the first light dimming layer 3, more material of the first light dimming layer 3 is filled between two adjacent light-emitting devices 2, so that the material of the first light dimming layer 3 is in contact with the two adjacent light-emitting devices 2. In this case, there is no gap between a portion of the first light dimming layer 3 between the two adjacent light-emitting devices 2 and the two adjacent light-emitting devices 2, and the portion of the first light dimming layer 3 is in contact with the two adjacent light-emitting devices 2.

In some other examples, as shown in FIGS. 3 to 5, the shape of the section may be, for example, a trapezoid or an approximate trapezoid.

That is, during the process of manufacturing the first light dimming layer 3, less material of the first light dimming layer 3 is filled between two adjacent light-emitting devices 2, so that the material of the first light dimming layer 3 is not in contact with the two adjacent light-emitting devices 2. In this case, there may be a gap between a portion of the first light dimming layer 3 to be formed by curing and the two adjacent light-emitting devices 2, and the portion of the first light dimming layer 3 is not in contact with the two adjacent light-emitting devices 2.

For example, the approximate trapezoid refers to a shape similar to a trapezoid, which may have an irregular portion compared with a regular trapezoid. For example, as shown in FIG. 4, a side edge c located between a top base b2 and a bottom base b1 of the approximate trapezoid is non-linear.

In some examples, as shown in FIG. 5, in a case where the shape of sectional includes an approximate trapezoid, a top base b2 of the approximate trapezoid smoothly transitions to a side edge c located between the top base b2 and a bottom base b1.

Since the first light dimming layer 3 is formed by curing the flowable light-absorbing material, when the material of the first light dimming layer 3 is provided on a side of the substrate 1, due to the existence of the surface tension of liquids, the shape of the section, taken along the plane PL parallel to the thickness direction of the substrate 1 and parallel to the connection line of centers of the two adjacent light-emitting devices 2, of the portion of the first light dimming layer 3 located between the two adjacent light-emitting devices 2 may include an approximate trapezoid, and the top base b2 of the approximate trapezoid transitions to the side edge c thereof smoothly.

In some examples, as shown in FIG. 5, in the direction Z parallel to thickness direction of the substrate 1 and moving away from the substrate 1, the areas of the orthographic projections of the plurality of cross sections F on the substrate 1 decrease in order. In the trapezoid or approximate trapezoid in which is the shape of the section of the portion of the first light dimming layer 3 located between the two adjacent light-emitting devices 2, the length of the bottom base b1 thereof proximate to the substrate 1 is greater than the length of the top base b2 thereof away from the substrate 1.

Further, in the examples where the portion of the first light dimming layer 3 located between the two adjacent light-emitting devices 2 has three cross-sections F parallel to the substrate 1, the area of the orthographic projection of the first cross section on the substrate 1 is greater than the area of the orthographic projection of the second cross section on the substrate 1, and the area of the orthographic projection of the second cross section on the substrate 1 is greater than the area of the orthographic projection of the third cross section on the substrate 1.

The orthographic projection of the third cross section on the substrate 1 may be located within the orthographic projection of the second cross section on the substrate 1. The orthographic projection of the second cross section on the substrate 1 may be located within the orthographic projection of the first cross section on the substrate 1. For example, the shape of the section, taken along the plane PL parallel to the thickness direction of the substrate 1 and parallel to the connection line of centers of the two adjacent light-emitting devices 2, of the portion of the first light dimming layer 3 located between the two adjacent light-emitting devices 2 may be a trapezoid or an approximate trapezoid. For example, the trapezoid may be a right trapezoid. The approximate trapezoid may be an approximate right trapezoid.

In some embodiments, as shown in FIG. 2, an angle between the surface d of the first light dimming layer 3 away from the substrate 1 and a side face e of the first light dimming layer 3 corresponding to an edge of the substrate 1 is a right angle or an approximate right angle.

For example, the side face e of the first light dimming layer 3 corresponding to the edge of the substrate 1 refers to a surface of the light dimming layer 3 connected to the edge of the substrate 1. There is an angle (the angle is, for example, greater than or equal to 90°) between the surface and a plane where the substrate 1 is located; and there is an angle (the angle is, for example, greater than or equal to 90°) between the surface (i.e., the side face e) and the surface d of the first light dimming layer 3 away from the substrate 1.

The description that "an angle between a surface d of the first light dimming layer 3 away from the substrate 1 and a side surface e of the first light dimming layer 3 corresponding to an edge of the substrate 1 is a right angle or an approximate right angle" indicates that, the surface d of the first light dimming layer 3 away from the substrate 1 is directly connected to the side face e of the first light dimming layer 3 corresponding to the edge of the substrate 1 with no smooth transition or substantially no smooth transition; therefore, no chamfer or substantially no chamfer is formed therebetween.

Since the first fixing layer 4 is a light-transmitting film, a main visual effect is provided by the first light dimming layer 3 when a user views the display substrate 100. By setting the angle between the surface d of the first light dimming layer 3 away from the substrate 1 and the side face e of the first light dimming layer 3 corresponding to the edge of the substrate 1 to be a right angle or an approximate right angle, after a plurality of display substrates 100 are spliced together, there will be no gap or substantially no gap between two adjacent first light dimming layers 3, and a plurality of first light dimming layers 3 in the plurality of display substrates 100 may be visually regarded as an integral structure. In this way, the splicing effect of the substrate formed by splicing the plurality of display substrates 100 together may be improved.

In some embodiments, as shown in FIGS. 13 to 16, the display substrate 100 further includes a second fixing layer 5.

Figure 13:
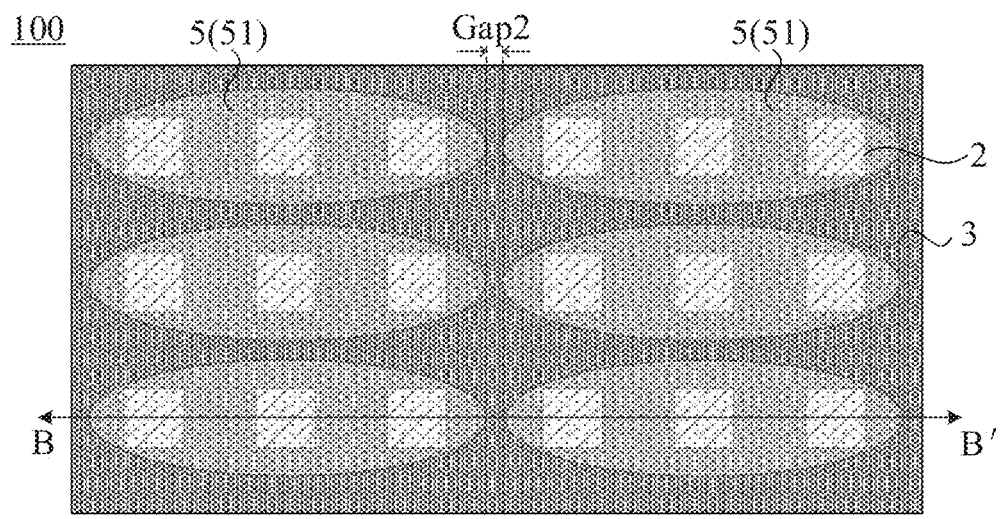
FIG. 13 is a top view of another display substrate, in accordance with some embodiments of the present disclosure.

In some examples, as shown in FIG. 13, the second fixing layer 15 includes a plurality of fixing patterns 51 that are arranged at interval from each other. That is, there is a gap Gap2 between any two adjacent fixing patterns 51, and they are not in contact with each other. An arrangement of the plurality of fixing patterns 51 may be determined according to actual needs.

In some examples, as shown in FIGS. 13 to 16, a fixing pattern 51 surrounds a group of light-emitting devices 2 to fix the group of light-emitting devices 2.

For example, the description that "a fixing pattern 51 surrounds a group of light-emitting devices 2" may be that, the single fixing pattern 51 is located on a peripheral side of the group of light-emitting devices 2.

For example, in a case where the group of light-emitting devices 2 includes one light-emitting device 2, the single fixing pattern 51 may be located on a peripheral side of the light-emitting device 2, and may be in contact with all side faces of the light-emitting device 2, so as to fix the light-emitting device 2. Or, as shown in FIG. 14, in a case where the group of light-emitting devices 2 includes light-emitting devices 2, the single fixing pattern 51 may be located on a peripheral side of each of the light-emitting devices 2, and may be in contact with all side faces of all the light-emitting devices 2, so as to fix the light-emitting devices 2.

For example, the description that "a fixing pattern 51 surrounds a group of light-emitting devices 2" may also be that, the fixing pattern 51 is located on a peripheral side of the group of light-emitting devices 2 and located on surfaces of the group of light-emitting devices 2 away from the substrate 1.

Figure 15:
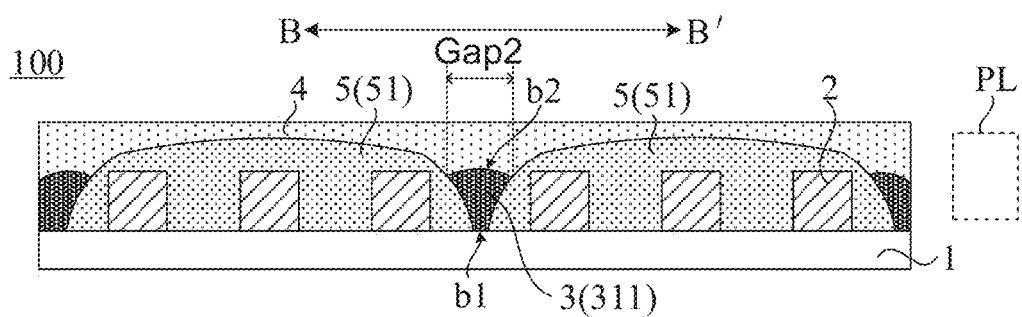
FIG. 15 is another sectional view of the display substrate shown in FIG. 13 taken along the line B-B'.

For example, in the case where the group of light-emitting devices 2 surrounded by the fixing pattern includes one light-emitting device 2, the fixing pattern 51 may be located on a peripheral side of the light-emitting device 2 and located on a surface of the light-emitting device 2 away from the substrate 1, and may be in contact with all side faces of the light-emitting device 2 and a surface of the light-emitting device 2 away from the substrate 1, so as to fix the light-emitting device 2. Or, as shown in FIGS. 15 and 16, in the case where the group of light-emitting devices 2 surrounded by the fixing pattern includes light-emitting devices 2, the fixing pattern 51 may be located on a peripheral side of each of the light-emitting devices 2 and a surface of each of the light-emitting devices 2 away from the substrate 1, and may be in contact with all side faces of all of the light-emitting devices 2 and the surfaces of the light-emitting devices 2 away from the substrate 1, so as to fix the light-emitting devices 2.

In some examples, each group of light-emitting devices 2 includes at least two light-emitting devices 2, and a fixing pattern 51 fixes the at least two light-emitting devices 2.

For example, a light-emitting device 2 of the at least two light-emitting devices 2 is configured to emit light of a single color. For example, the light may be red light, green light or blue light. For another example, the light may be magenta light, yellow light or cyan light. For still another example, the light may be white light.

For example, light emitted by all of the at least two light-emitting devices 2 is of at least one color.

In a case where the light emitted by all light-emitting devices 2 includes a single color, all light-emitting devices 2 of the at least two light-emitting devices 2 emit the same color of light.

In a case where the light emitted by the at least two light-emitting devices 2 includes at least two colors, all light-emitting devices 2 of the at least two light-emitting devices 2 may each emit a different color of light, or some light-emitting devices 2 may emit the same color of light.

For example, a group of light-emitting devices 2 includes three light-emitting devices 2, and the three light-emitting devices 2 include at least one of a red light-emitting device, a green light-emitting device and a blue light-emitting device. In a case where the three light-emitting devices 2 include a red light-emitting device, a green light-emitting device and a blue light-emitting device, the three light-emitting devices 2 may form a pixel unit.

The light-emitting devices 2 may also include a white light-emitting device.

For example, the second fixing layer 5 is a light-transmitting layer. That is, the second fixing layer 5 may have a good light transmittance. In this way, it may be possible to reduce or avoid a loss of light passing through the fixing patterns 51, and thus achieve a high light extraction efficiency when the light-emitting devices 2 emit light to make the display substrate 100 perform display.

For example, the second fixing layer 5 is formed by curing a flowable light-transmitting material. A time interval between printing the material of the second fixing layer 5 on the substrate 1 and curing the material of the second fixing layer 5 is relatively short; moreover, due to the existence of the surface tension of liquids, a shape of a section, taken along the line B-B' in FIG. 13, of each fixing pattern 51 of the second fixing layer 5 may be or may be similar to the shapes shown in FIGS. 15 and 16. In this case, a surface of each fixing pattern 51 away from the substrate 1 is arc-shaped. On a basis that each fixing pattern 51 covers and surrounds a corresponding group of light-emitting devices 2, an area of an orthographic projection of each fixing pattern 51 on the substrate 1 is relatively small. An orthographic projection of the surface of each fixing pattern 51 away from the substrate 1 on the substrate 1 is located within an orthographic projection of a surface of the fixing pattern 51 proximate to the substrate 1 on the substrate 1.

In some examples, as shown in FIGS. 14 to 16, a portion 311 of the first light dimming layer 3 is located in a gap Gap2 between any two adjacent fixing patterns 51 of the plurality of fixing patterns 51, and is in contact with the two adjacent fixing patterns 51. In this case, the portion 311 of the first light dimming layer 3 is separated from light-emitting devices 2 adjacent thereto by the two adjacent fixing patterns 51, and is not in contact with the light-emitting devices 2 adjacent thereto. The first light dimming layer 3 may be in a shape of a grid, and each square in the grid is provided with a group of light-emitting devices 2, which is covered and surrounded by a single fixing pattern 51.

As shown in FIGS. 14 to 16, since the orthographic projection of the surface of each fixing pattern 51 away from the substrate 1 on the substrate 1 is located within the orthographic projection of the surface of each fixing pattern 51 proximate to the substrate 1 on the substrate 1, a dimension, in a direction perpendicular to the thickness direction of the substrate 1, of a gap Gap2 between every two adjacent fixing patterns 51 increases in order in the direction parrallel to the thickness direction of the substrate 1 and moving away from the substrate 1.

Based on this, as shown in FIGS. 14 to 16, after the portion of the first light dimming layer 3 is formed in the gap between every two adjacent fixing patterns 51, a shape of a section, taken along the plane PL parrallel to the thickness direction of the base 1 and the connection line of the centers of two adjacent light-emitting devices 2, of the portion of the first light dimming layer 3 located between the two adjacent light-emitting devices 2 includes a trapezoid or an approximate trapezoid. A length of a bottom base b1 of the trapezoid or approximate trapezoid proximate to the substrate 1 is less than a length of a top base b2 thereof away from the substrate 1. That is, the trapezoid or approximate trapezoid is an inverted trapezoid.

In addition, as shown in FIG. 15, due to the existence of the surface tension of liquids, a surface of the portion of the first light dimming layer 3 located between the two adjacent fixing patterns 51 away from the substrate 1 may be, for example, arc-shaped.

By providing the second fixing layer 5, it may be possible to reduce an influence of the first light dimming layer 3 on the light-emitting devices 2, and reduce the mura effect of the display substrate 100 at a relatively large viewing angle.

In some examples, as shown in FIGS. 14 to 16, the first fixing layer 4 may be located on a side of the second fixing layer 5 and the first light dimming layer 3 away from the substrate 1.

For example, an orthographic projection of the second fixing layer 5 on the substrate 1 may be located within the orthographic projection of the first fixing layer 4 on the substrate 1.

By arranging the first fixing layer 4 on the side of the second fixing layer 5 and the first light dimming layer 3 away from the substrate 1, it may not only be possible to use the first fixing layer 4 to fix the second fixing layer 5 and the first light dimming layer 3, and thus fix the light-emitting devices 2, but it may also be possible to use the first fixing layer 4 to enable the display substrate 100 to have a relatively flat surface as a whole, and thus improve the uniformity of the surface.

In some embodiments, as shown in FIGS. 8, 9, 10, 12 and 16, the display substrate 100 may further include a plurality of light-transmitting particles 6 disposed on a side of the first fixing layer 4 away from the substrate 1. The plurality of light-transmitting particles 6 may be, for example, disposed on the surface of the first fixing layer 4 away from the substrate 1.

In some examples, the plurality of light-transmitting particles 6 are configured to change a propagation direction of at least a portion of light entering the plurality of light-transmitting particles 6.

It will be noted that, an effect of changing the propagation direction of the light of the light-transmitting particles 6 is related to a shape of the light-transmitting particles 6.

For example, as shown in FIG. 10, a shape of surfaces of the plurality of light-transmitting particles 6 includes at least one of a pyramid and a wedge. A tip of the pyramid or wedge is located on a side of a light-transmitting particle 6 away from the substrate 1. In this case, the plurality of light-transmitting particles 6 may be able to concentrate at least a portion of the light emitted by the plurality of light-emitting devices 2 and passing through the plurality of light-transmitting particles 6. In this way, a display brightness of the display substrate 100 may be improved.

In this case, relative to the substrate 1, if the surface of the first light dimming layer 3 away from the substrate 1 is higher than the surfaces of the light-emitting devices 2 away from the substrate 1, the viewing angle of the display substrate 100 may be further narrowed, and the anti-peep effect of the display substrate 100 may be further improved.

For example, as shown in FIG. 9, the shape of the surfaces of the plurality of light-transmitting particles 6 includes at least one of an arc surface and a spherical surface. In this case, the plurality of light-transmitting particles 6 may be able to diffuse at least a portion of the light emitted by the plurality of light-emitting devices 2 and passing through the plurality of light-transmitting particles 6, which is beneficial to improving the uniformity of light emitted from the display substrate 100. In addition, the plurality of light-transmitting particles 6 may further be able to cause diffuse reflection of at least a portion of light incident on the plurality of light-transmitting particles 6 from the outside, and thus improve the display effect of the display substrate 100.

Figure 17:
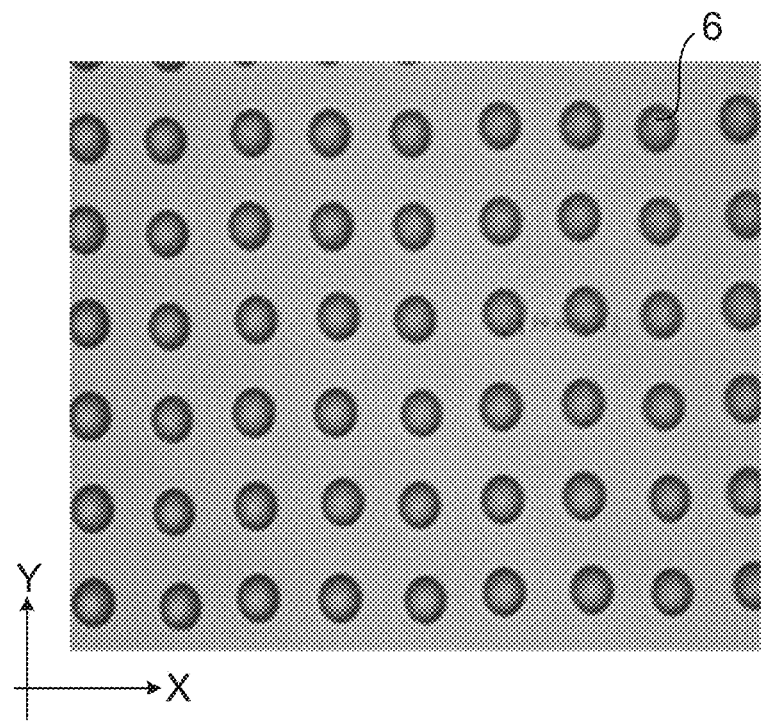
FIG. 17 is a scanning electron microscope (SEM) imaging diagram of a kind of light-transmitting particles, in accordance with some embodiments of the present disclosure.
Figure 18:
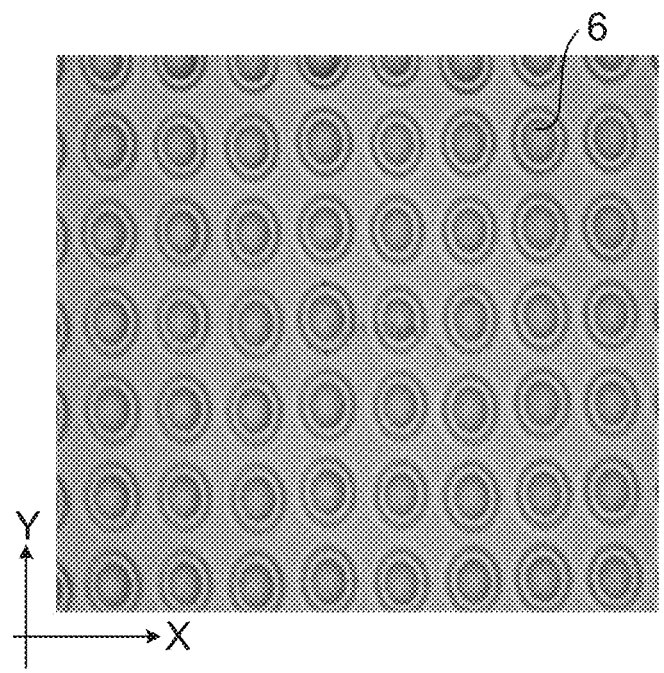
FIG. 18 is an SEM imaging diagram of another kind of light-transmitting particles, in accordance with some embodiments of the present disclosure.

In some examples, as shown in FIGS. 17 and 18, the plurality of light-transmitting particles 6 may be arranged in an array. That is, the plurality of light-transmitting particles 6 may be arranged in a plurality of rows in a first direction X and arranged in a plurality of columns in a second direction Y.

Herein, the first direction X intersects the second direction Y. For example, as shown in FIGS. 17 and 18, an angle between the first direction X and the second direction Y is 90°.

By arranging the plurality of light-transmitting particles 6 in a regular manner, it may be possible to improve a viewing angle range and an appearance of the display substrate 100.

In some examples, of the plurality of light-transmitting particles 6, a distance between any two adjacent light-transmitting particles is in a range of 95 μm to 105 μm, inclusive (100 μm±5 μm). Here, the distance refers to a minimum distance between the two adjacent light-transmitting particles.

For example, the distance between any two adjacent light-transmitting particles is 95 μm, 97 μm, 100 μm, 104 μm, or 105 μm.

By setting the distance between any two adjacent light-transmitting particles 6 of the plurality of light-transmitting particles 6 to the above range, it may be possible to improve the viewing angle range and the appearance of the display substrate 100.

In some examples, a thickness of each light-transmitting particle 6 may be in a range of 6 μm to 12 μm, inclusive (9 μm±3 μm).

For example, the thickness of each light-transmitting particle 6 is 6 μm, 7 μm, 9 μm, 11 μm, or 12 μm.

By setting the thickness of each light-transmitting particle 6 to the above range, it may be possible to improve the viewing angle range and the appearance of the display substrate 100.

In some examples, a dimension of an orthographic projection of each light-transmitting particle 6 on the substrate 1 is in a range of 45 μm to 55 μm, inclusive (50 μm±5 μm). Here, the dimension of the orthographic projection of each light-transmitting particle 6 on the substrate 1 refers to a distance between two points at which a straight line passing through a center of the orthographic projection intersects a boundary of the orthographic projection. The dimension may be, for example, a maximum distance, a minimum distance or an average distance.

For example, if a shape of the orthographic projection of each light-transmitting particle 6 on the substrate 1 is a circle, the dimension may be a diameter of the circle; if the shape of the orthographic projection of each light-transmitting particle 6 on the substrate 1 is a square, the dimension may be a diagonal length of the square or a side length of the square.

For example, the dimension of the orthographic projection of each light-transmitting particle 6 on the substrate 1 may be 45 μm, 46 μm, 47 μm, 50 μm, 52 μm, or 55 μm.

By setting the dimension of the orthographic projection of each light-transmitting particle 6 on the substrate 1 to the above range, it may be possible to improve the viewing angle range and the appearance of the display substrate 100.

It will be noted that, a material of the plurality of light-transmitting particles 6 may be a material with a relatively high light transmittance. In this way, it may be possible to prevent the arrangements of the light-transmitting particles 6 from affecting the light extraction efficiency of the light-emitting devices 2.

For example, the material of the light-transmitting particles 6 includes polyacetate resin. The polyacetate resin is, for example, doped with titanium dioxide or diffusion powder.

In addition, the light-transmitting particles 6 may be formed by curing a flowable light-transmitting material. In this way, in a process of manufacturing the light-transmitting particles 6, a time interval between dropping the flowable light-transmitting material onto the surface of the first fixing layer 4 away from the substrate 1 and curing the flowable light-transmitting material may be determined according to needs, so that the light-transmitting particles 6 formed by curing have a desired shape.

Figure 11:
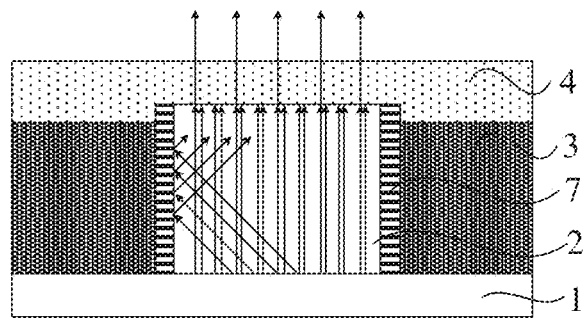
FIG. 11 is an optical path diagram of still another display substrate, in accordance with some embodiments of the present disclosure.

In some embodiments, as shown in FIG. 11, the display substrate 100 further includes a light reflection layer 7 disposed on a side surface of each light-emitting device 2. The light reflection layer 7 is, for example, located on each side face of each light-emitting device 2.

In some examples, the light reflection layer 7 is configured to reflect light emitted by each light-emitting device 2 and incident on the light reflection layer 7.

For example, as shown in FIG. 11, light emitted by a certain light-emitting device 2 may be incident onto the light reflection layer 7 disposed on a side face of the light-emitting device 2, and then, under a reflection effect of the light-reflecting layer 7, be reflected back to the light-emitting device 2 and exit from a side of the light-emitting device 2 away from the substrate 1.

By providing the light reflection layer 7, it may be possible to increase a utilization rate of the light emitted by the light-emitting device 2, improve the light extraction efficiency of the display substrate 100, and thereby reduce a power consumption of the display substrate 100.

A material of the light reflection layer 7 may vary, and may be determined according to actual needs, as long as the light emitted by the light-emitting device 2 can be reflected, and electrical property of the light-emitting devices 2 is not affected. For example, the material of the light reflection layer 7 includes but is not limited to white ink.

It will be noted that, the light-emitting device 2 and the substrate 1 are usually electrically connected by pads.

Figure 20:
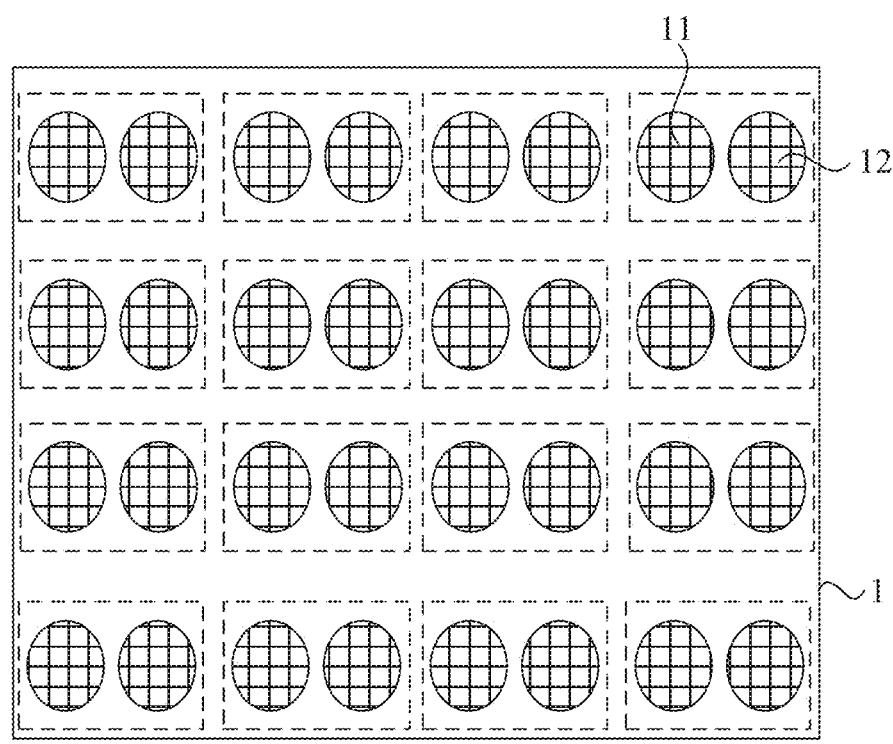
FIG. 20 is a structural diagram of a substrate, in accordance with some embodiments of the present disclosure.

In some embodiments, as shown in FIGS. 20 and 22, a plurality of pads are provided on the substrate 1, and the plurality of pads include anode pads 11 and cathode pads 12.

Figure 19:
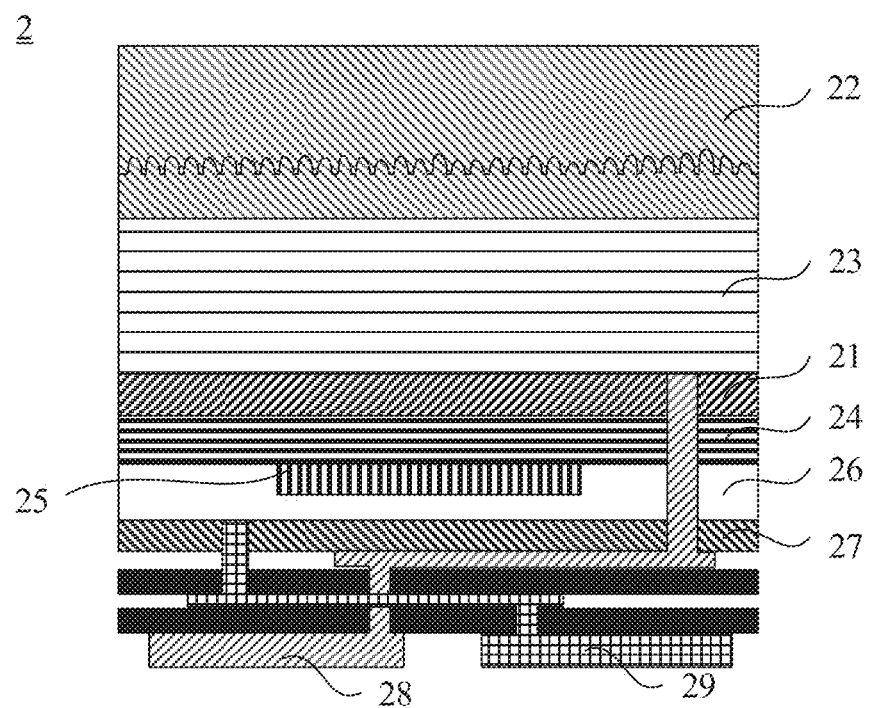
FIG. 19 is a structural diagram of a light-emitting device, in accordance with some embodiments of the present disclosure.

Referring to FIG. 19, a structure of the light-emitting device 2 and a connection manner between the light-emitting device 2 and the substrate 1 will be schematically described below by taking an example where the light-emitting device 2 is a Mini LED.

In some examples, as shown in FIG. 19, the light-emitting device 2 includes a base 22, an N-type semiconductor layer 23, a light-emitting layer 21, a P-type semiconductor layer 24, a current blocking layer 25, a conductive layer 26, a Bragg reflection layer 27, a cathode electrode pin 28 and an anode electrode pin 29 that are stacked in sequence. The cathode electrode pin 28 is connected to the N-type semiconductor layer 23. The anode electrode pin 29 is connected to the conductive layer 26.

For example, the light-emitting layer 21 is capable of emitting light. Light emitted by each light-emitting layer 21 may propagate to the outside after passing through the base 22, the first light dimming layer 3 and the first fixing layer 4 in sequence.

In a case where the structure shown in FIG. 19 is applied to the display substrate 100, the cathode electrode pin 28 is electrically connected to a cathode pad 12 (for example, the cathode electrode pin 28 is inserted into the cathode pad 12), and the anode electrode pin 29 is electrically connected to an anode pad 11 (for example, the anode electrode pin 29 is inserted into the anode pad 11).

For example, a distance between the surface of the light-emitting device 2 away from the substrate 1 and the substrate 1 is a sum of a thickness of the pad and a thickness of the light-emitting device 2.

In some embodiments, as shown in FIG. 12, the display substrate 100 further includes a plurality of functional devices 8. At least one functional device 8 of the plurality of functional devices 8 is disposed on a same side of the substrate as the light-emitting devices 2.

In some examples, the plurality of functional devices 8 are configured to provide sensing signals, and/or to provide control signals for the light-emitting devices 2. That is, the plurality of functional devices 8 may all be used to provide sensing signals, or may all be used to provide control signals for the light-emitting devices 2. It may also be that a portion of the plurality of functional devices 8 are used to provide sensing signals, while another portion of the plurality of functional devices 8 are used to provide control signals for the light-emitting device 2.

For example, functional devices 8 used to provide sensing signals include touch sensor devices, infrared sensor devices or distance sensor devices.

For example, functional devices 8 used to provide control signals for the light-emitting device 2 include a driver integrated circuit (IC).

In some examples, in a case where the at least one functional device 8 is disposed on the same side of the substrate as the light-emitting devices 2, relative to the substrate 1, the surface of the first fixing layer 4 away from the substrate 1 is higher than a surface of the at least one functional device 8 away from the substrate 1. That is, a distance between the surface of the first fixing layer 4 away from the substrate 1 and the substrate 1 is greater than a distance between the surface of the at least one functional device 8 away from the substrate 1 and the substrate 1.

In the embodiments of the present disclosure, a manner in which the light-emitting devices 2 are driven to make the display substrate 100 display images may vary, which may be determined according to needs.

In some embodiments, the display substrate 100 adopts a direct driving manner by using driving chips (also called driving ICs) to drive the light-emitting devices 2 to emit light.

Figure 21:
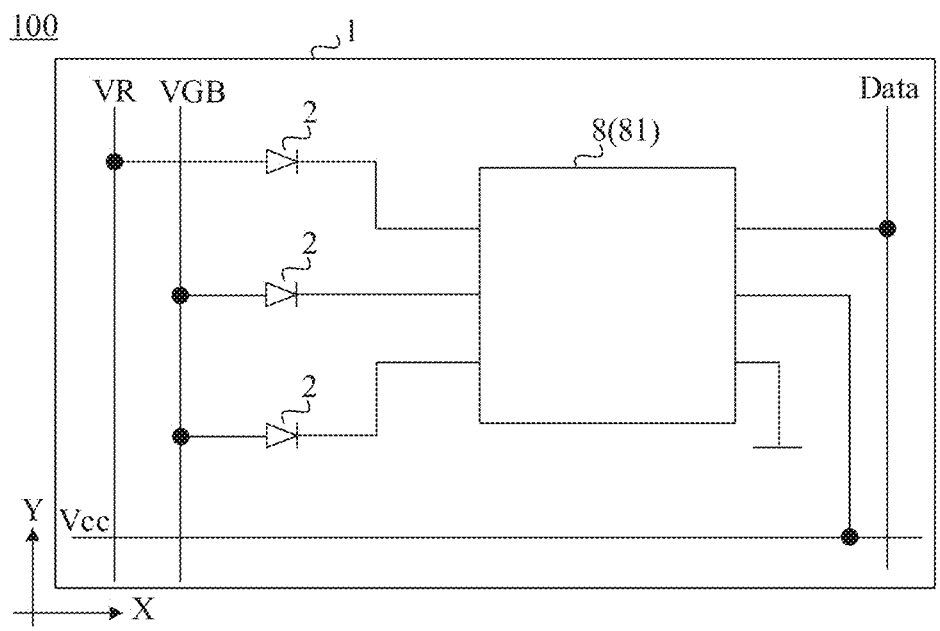
FIG. 21 is a schematic diagram of a display substrate, in accordance with some embodiments of the present disclosure.

In some examples, as shown in FIGS. 12 and 21, the plurality of functional devices 8 include a plurality of driving chips 81. The plurality of driving chips 81 are located on a same side of the substrate 1 as the light-emitting devices 2. A driving chip 81 is electrically connected to a group of light-emitting devices 2.

For example, as shown in FIG. 21, in a case where a group of light-emitting devices 2 includes three light-emitting devices 2, a driving chip 81 may be electrically connected to three light-emitting devices 2. The three light-emitting devices 2 include, for example, a red light-emitting device, a green light-emitting device and a blue light-emitting device.

For example, as shown in FIG. 21, the substrate 1 is further provided with a plurality of power supply voltage signal lines Vcc extending in the first direction X, and a plurality of first voltage signal lines VR, a plurality of second voltage signal lines VGB, and a plurality of data lines Data that extend in the second direction Y.

For example, as shown in FIG. 21, an anode electrode pin of each red light-emitting device may be electrically connected to a single first voltage signal line VR through a corresponding anode pad; an anode electrode pin of each green light-emitting device may be electrically connected to a single second voltage signal line VGB through a corresponding anode pad; and an anode electrode pin of each blue light-emitting device may be electrically connected to a single second voltage signal line VGB through a corresponding anode pad.

For example, as shown in FIG. 21, the driving chip 81 has six pins. Three of the six pins are electrically connected to cathode electrode pins of the three light-emitting devices 2 in one-to-one correspondence through cathode pads. Of the other three pins, one pin may be electrically connected to a data line Data, another pin may be electrically connected to a power supply voltage signal line Vcc, and yet another pin may be grounded.

In some examples, as shown in FIG. 12, the display substrate 100 further includes a second light dimming layer 9 disposed on surfaces of the plurality of driving chips 81 away from the substrate 1. The second light dimming layer 9 is configured to reduce reflection of light incident on the surfaces of the plurality of driving chips 81 by the plurality of driving chips 81.

Here, the surfaces of the driving chips 81 away from the substrate 1 have a relatively high reflectivity to light. By providing the second light dimming layer 9, it may be possible to reduce the reflection of the light incident on the surfaces of the driving chips 81 by the driving chips 81. In this way, in the case where the display state of the display substrate 100 is the dark state (that is, the light-emitting devices 2 do not emit light), the display surface of the display substrate 100 may be in a darker state, and the contrast of the display substrate 100 may be effectively improved.

For example, a material of the second light dimming layer 9 is the same as the material of the first fixing layer 4. Although the material of the first fixing layer 4 has a high light transmittance, the first fixing layer 4 still causes a certain loss of the light passing through the first fixing layer 4. By setting the material of the second light dimming layer 9 to be the same as the material of the first fixing layer 4, it may be possible to cause a certain loss of light when the light passes through the second light dimming layer 9 and incidents on the surfaces of the driving chips 81 away from the substrate 1, and after light after the loss is reflected by the surfaces of the driving chips 81 away from the substrate 1, it may be possible to further cause a loss of light when the reflected light passes through the second light dimming layer 9 and exits to the outside. As a result, it may be possible to reduce the reflection of the light incident on the surfaces of the driving chips 81 by the driving chips 81.

For example, the material of the second light dimming layer 9 is the same as the material of the first light dimming layer 3. In this case, when the light passes through the second light dimming layer 9 and incidents on the surfaces of the driving chips 81 away from the substrate 1, the second light dimming layer 9 may be used to effectively absorb the light, so as to reduce the reflection of the light incident on the surfaces of the driving chips 81 by the driving chips 81.

Here, a distance between a surface of the second light dimming layer 9 proximate to the driving chips 81 and a surface of the second light dimming layer 9 away from the driving chips 81 (i.e., a thickness of the second light dimming layer 9) may be determined according to actual needs, as long as it is possible to reduce the reflection of the light incident on the surfaces of the driving chips 81 by the driving chips 81.

For example, the thickness of the second light dimming layer 9 is in a range of 20 μm to 40 μm. In this way, not only an effect of reducing light reflection may be ensured, but also a waste of materials may be avoided.

For example, the thickness of the second light dimming layer 9 is 20 μm, 25 μm, 30 μm, 33 μm, or 40 μm.

In addition, for example, relative to the substrate 1, the surface of the first fixing layer 4 away from the substrate 1 is higher than the surfaces of the driving chips 81 away from the substrate 1. Relative to the substrate 1, a surface of the second light dimming layer 9 away from the substrate 1 is flush with or higher than the surface of the first fixing layer 4 away from the substrate 1.

In this way, it may be possible to prevent a relatively large difference between a distance between the surface of the second light dimming layer 9 away from the substrate 1 and the substrate 1 and the distance between the surface of the first fixing layer 4 away from the substrate 1 and the substrate 1 from affecting the appearance of the display substrate 100.

For example, the difference between the distance between the surface of the second light dimming layer 9 away from the substrate 1 and the substrate 1 and the distance between the surface of the first fixing layer 4 away from the substrate 1 and the substrate 1 is in a range of 0 μm to 20 μm.

It will be noted that, the above examples are only exemplary illustrations of a manner in which the display substrate 100 uses the driving chips to directly drive the light-emitting devices 2; there may be other connection manners between the driving chips and the light-emitting devices 2, and details will not be repeated here.

In some other embodiments, the display substrate 100 may adopt a manner in which pixel driving circuits are used to drive the light-emitting devices 2 to emit light.

In some examples, as shown in FIG. 22, the substrate 1 is provided with a plurality of gate lines Gate extending in the first direction X, and a plurality of data lines Data and a plurality of electrode leads 13 that extend in the second direction Y. The plurality of gate lines Gate and the plurality of data lines Data intersect each other to define the plurality of sub-pixel regions P.

In a case where a sub-pixel region P is provided with a light-emitting device 2, as shown in FIG. 22, each sub-pixel region P may be provided with a pixel driving circuit 14. Pixel driving circuits 14 arranged in a row in the first direction X may be electrically connected to a gate line Gate, and pixel driving circuits 14 arranged in a row in the second direction Y may be electrically connected to a data line Data. An electrode lead 13 corresponds to pixel driving circuits 14 arranged in a row in the second direction Y.

Here, a structure of the pixel driving circuit 14 may vary. For example, the structure of the pixel driving circuit 14 may include a "2T1C", "6T1C", "7T1C", "6T2C", "7T2C", or the like. Here, "T" represents a thin film transistor, and the number before "T" represents the number of thin film transistors; "C" represents a storage capacitor, and the number before "C" represents the number of storage capacitors. Of a plurality of thin film transistors included in the pixel driving circuit 14 of each structure, one thin film transistor is a driving transistor. As shown in FIG. 22, the embodiments of the present disclosure illustrate an example where the pixel driving circuit 14 of a "2T1C" structure.

For example, as shown in FIGS. 22 and 23, each sub-pixel region P is provided with an anode pad 11 and a cathode pad 12. The anode pad 11 is electrically connected to the pixel driving circuit 14, and the cathode pad 12 is electrically connected to a corresponding electrode lead 13. In this way, the anode electrode pin of the light-emitting device 2 may be in contact with the anode pad 11, and the cathode electrode pin of the light-emitting device 2 may be in contact with the cathode pad 12, thereby achieving electrical connection between the light-emitting device 2 and the pixel driving circuit 14 and between the light-emitting device 2 and the electrode lead 13.

The pixel driving circuit 14 is configured to provide a driving voltage for the light-emitting device 2, and the electrode lead 13 is configured to provide a common voltage for the light-emitting device 2. In this way, due to the cooperation between the pixel driving circuit 14 and the electrode lead 13, it may be possible to control a light-emitting state of the light-emitting device 2, and thereby realize image display of the display substrate 100.

It will be noted that, the above example is only an illustrative description of an active driving manner adopted by the display substrate 100 to drive the light-emitting devices 2; circuits involved in the active driving manner may also have other structures, and details will not be repeated here.

The display substrate 100 of the embodiments of the present disclosure may also adopt a passive driving manner to drive the light-emitting devices 2 to emit light, and details will not be repeated here.

It will be noted that, in a case where the substrate 1 is provided with the above lines (that is, the data lines Data, the gate lines Gate, or lines connecting the transistors), the first light dimming layer 3 may cover at least a portion of the lines. An insulating layer may be provided between the first light dimming layer 3 and the above lines. In this way, it may not only be possible to protect the above lines, but it also may be possible to avoid corrosion of the above lines and prevent such corrosion from affecting the electrical properties of the above lines.

Some embodiments of the present disclosure provide a method for manufacturing a display substrate. As shown in FIGS. 24 and 27, the method includes steps 100 to 300 (S100 to S300).

Figure 28A:
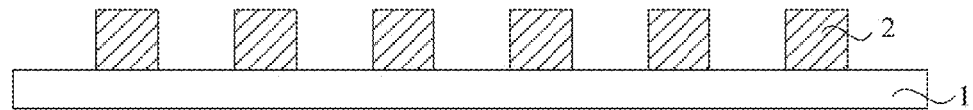
FIGS. 28(a) to 28(g) are diagrams showing steps of a method for manufacturing a display substrate, in accordance with some embodiments of the present disclosure.

In S100, as shown in FIG. 28(a), a substrate 1 is provided. A plurality of light-emitting devices 2 are provided on a side of the substrate 1 at intervals from each other. The plurality of light-emitting devices 2 are divided into a plurality of groups of light-emitting devices 2, and each group of light-emitting devices 2 includes at least one light-emitting device 2.

In some examples, the plurality of light-emitting devices 2 may include Mini LEDs. When the plurality of light-emitting devices 2 are provided on the side of the substrate 1, the plurality of light-emitting devices 2 may be transferred to the side of the substrate 1 by, for example, a mass transfer technology.

Here, regarding a structure of the substrate 1, structures of the plurality of light-emitting devices 2, and a connection manner between the substrate 1 and the plurality of light-emitting devices 2, reference may be made to the descriptions in some of the above embodiments, and details will not be repeated here.

In some examples, after the plurality of light-emitting devices 2 are disposed on the substrate 1, the plurality of light-emitting devices 2 and the substrate 1 may be cleaned to remove foreign matters on a surface of the substrate 1 and side faces of the light-emitting devices 2 and surfaces of the light-emitting devices 2 away from the substrate 1, so as to increase surface energy and improve a bonding force between the substrate 1, the light-emitting devices 2 and films to be formed subsequently.

For example, the substrate 1 and the light-emitting devices 2 may be cleaned by at least one of an ultrasonic cleaning method, a plasma cleaning method and an air gun blowing method, as long as the substrate 1 and the light-emitting devices 2 can be cleaned.

Figure 28B:
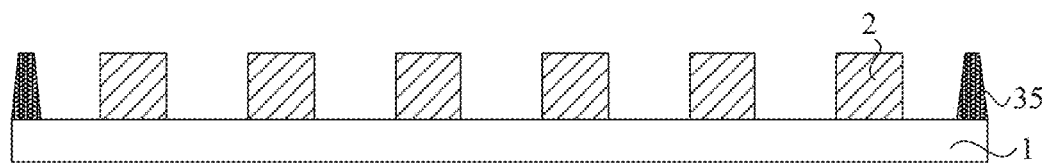
Figure 28C:
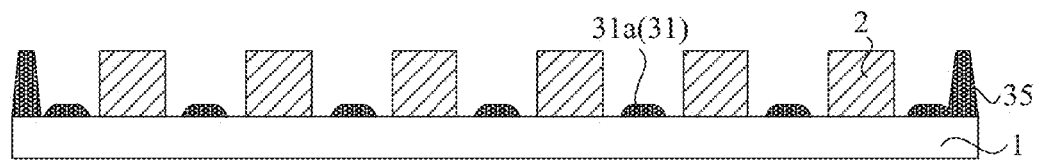
Figure 28D:
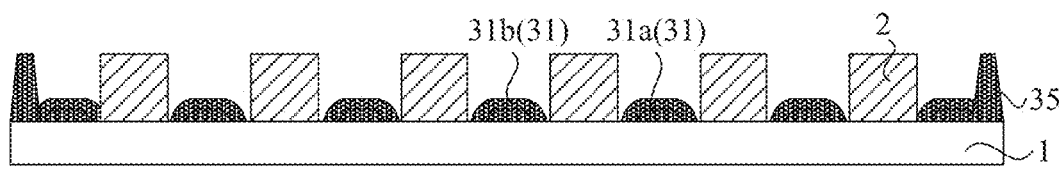
Figure 28E:
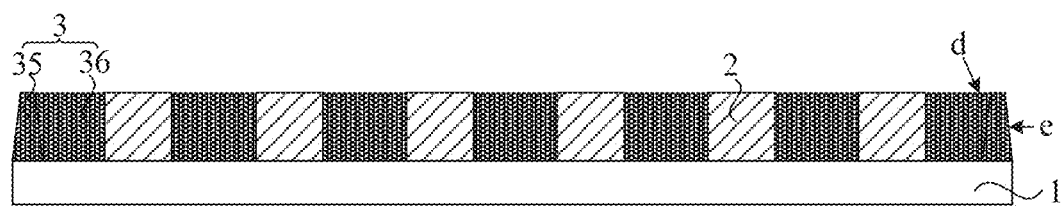
Figure 28F:
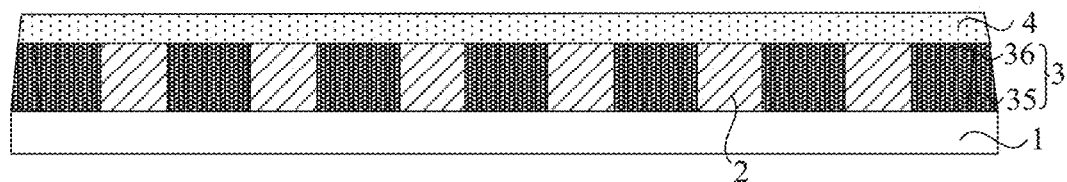
Figure 28G:
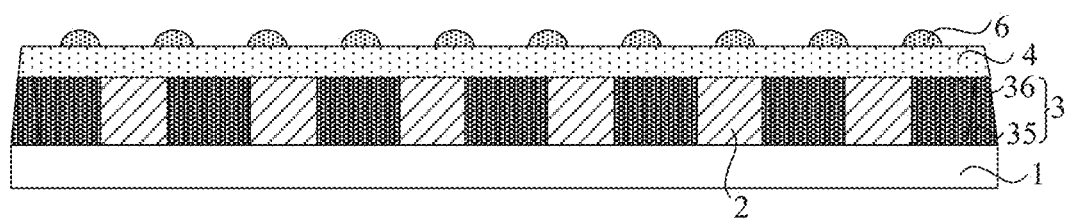
Figure 29A:
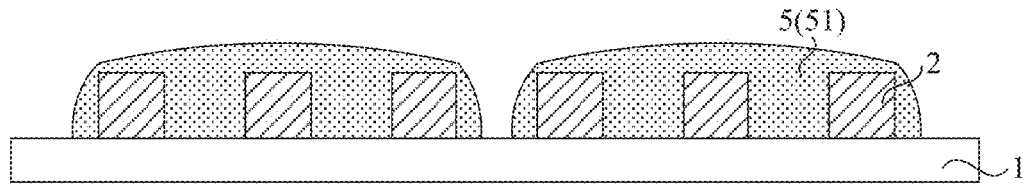
FIGS. 29(a) to 29(d) are diagrams showing steps of a method for manufacturing another display substrate, in accordance with some embodiments of the present disclosure.
Figure 29B:
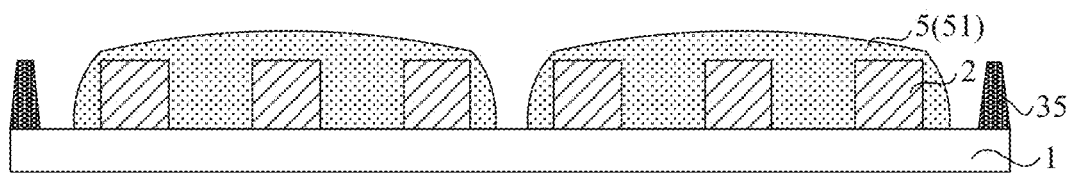
Figure 29C:
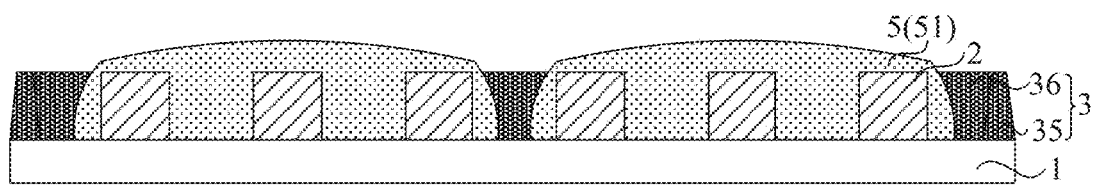
Figure 29D:
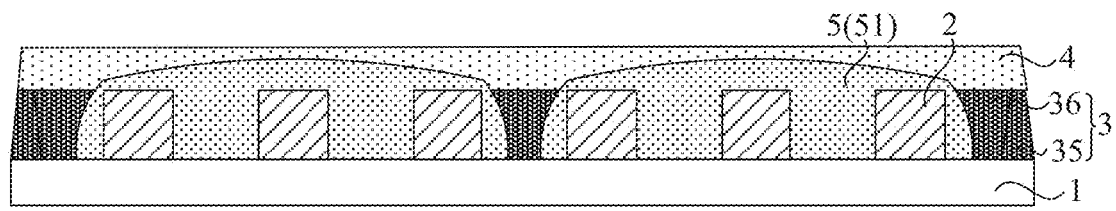

In S200, as shown in FIGS. 28(e) and 29(c), a first light dimming layer 3 is formed on the side of the substrate 1 by inkjet printing. The first light dimming layer 3 includes portions each located between two adjacent groups of light-emitting devices 2. A gap exists between a portion of the first light dimming layer 3 and at least one side face of light-emitting device(s) 2 adjacent thereto.

For example, a material of the first light dimming layer 3 includes a flowable light-absorbing material. The light dimming layer 3 is configured to absorb at least a portion of light entering the light dimming layer 3.

Since the material of the first light dimming layer 3 is flowable, in a process of forming the first light dimming layer 3 by inkjet printing, the flowable light-absorbing material may be printed between two adjacent groups of light-emitting devices 2 by an inkjet printing device, and then be cured to obtain a portion of the first light dimming layer 3. By setting a time interval between dropping the material of the first light dimming layer 3 between the two adjacent groups of light-emitting devices 2 and curing the material to a suitable value, it may be possible to obtain the portion of the first light dimming layer 3 with a desired shape.

For example, in a case of a long time interval, the material of the first light dimming layer 3 flows and spreads to a relatively large area; as a result, the portion of the first light dimming layer 3 formed after curing has a planar shape with a relatively small thickness, and an area of an orthographic projection of the portion of the first light dimming layer 3 on the substrate 1 is relatively large. In a case of a short time interval, the material of the first light dimming layer 3 flows and spreads to a relatively small area; as a result, the portion of the first light dimming layer 3 formed after curing is block-shaped with a relatively large thickness, and the area of the orthographic projection of the portion of the first light dimming layer 3 on the substrate 1 is relatively small.

For example, a curing method may vary, which may be determined according to properties of the material of the first light dimming layer 3. For example, the curing method may be a light curing method, a thermal curing method, or other chemical and physical methods.

For example, the embodiments of the present disclosure adopts an ultraviolet curing (i.e., UV curing) method.

In some examples, the step of forming the first light dimming layer 3 on the side of the substrate 1 by inkjet printing (S200) includes forming a plurality of light dimming sub-layers 31 on the side of the substrate 1 by inkjet printing in sequence. The plurality of light dimming sub-layers 31 are stacked to form the first light dimming layer 3.

That is, the first light dimming layer 3 is formed through a plurality of inkjet printing processes. For example, after each light dimming film is formed, the light dimming film is cured to form a single light dimming sub-layer 31.

For example, a thickness of the light dimming film formed by an inkjet printing process may be approximately 5 μm, and the energy for curing the light dimming film by the UV curing method may be approximately 3000 mJ.

In an example where a distance between a surface of the first light dimming layer 3 away from the substrate 1 and the substrate 1 is 80 μm, if a thickness of the light dimming sub-layer 31 formed each time is 5 μm, the first light dimming layer 3 may be obtained by forming sixteen light dimming sub-layers 31 that are stacked in sequence through sixteen inkjet printing processes.

Figure 25:
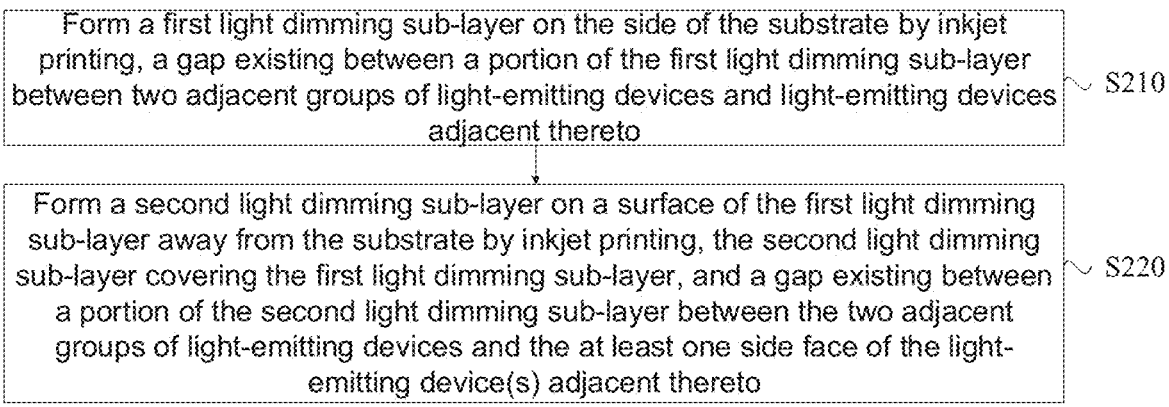
FIG. 25 is a flowchart of steps in S200 in the flowchart shown in FIG. 24.

In some examples, as shown in FIG. 25, forming the plurality of light dimming sub-layers 31 on the side of the substrate 1 by inkjet printing in sequence includes steps 210 to 220 (S210 to S220).

In S210, as shown in FIG. 28(c), a first light dimming sub-layer 31a is formed on the side of the substrate 1 by inkjet printing. The first light dimming sub-layer 31a includes portions each located between two adjacent groups of light-emitting devices 2. The first light dimming sub-layer 31a is in contact with the substrate 1, and a gap exists between a portion of the first light dimming sub-layer 31 between two adjacent groups of light-emitting devices and light-emitting devices 2 adjacent thereto.

Before the inkjet printing process, a distance between a nozzle in an inkjet printing device for ejecting the material of the first light dimming layer 3 and the light-emitting devices 2 in a direction perpendicular to a thickness direction of the substrate 1 may be adjusted, so that a distance between the formed first light dimming sub-layer 31a and the light-emitting devices 2 adjacent thereto in the direction perpendicular to the thickness direction of the base 1 is a desired distance.

For example, before the inkjet printing process, the distance between the nozzle and the light-emitting devices 2 in the direction perpendicular to the thickness direction of the base 1 is greater than a position error of the light-emitting devices 2.

For example, the distance between the nozzle and the light-emitting devices 2 in the direction perpendicular to the thickness direction of the substrate 1 is in a range of 10 μm to 25 μm. For example, the distance between the nozzle and the light-emitting devices 2 is 10 μm, 13 μm, 17 μm, 20 μm or 25 μm. In this way, it may not only be possible to ensure a certain distance (the distance may be in the range of 10 μm to 25 μm) between the formed first light dimming sub-layer 31*a* and the light-emitting devices 2 adjacent thereto in the direction perpendicular to the thickness direction of the substrate 1, but it may also be possible to prevent the material of the first light dimming sub-layer 31*a* from being dropped on the side of the light-emitting devices 2 away from the substrate 1 and thus affecting a luminous efficiency of the display substrate 100.

Before the inkjet printing process, a distance between the nozzle and the light-emitting devices 2 in the thickness direction of the base 1 may also be adjusted, so as to avoid a collision between the nozzle and the light-emitting devices 2 and prevent such collision from affecting the quality of the light-emitting devices 2 and the connection between the light-emitting devices 2 and the substrate 1.

For example, before the inkjet printing process, relative to the substrate 1, an end of the nozzle proximate to the substrate 1 may be higher than the surfaces of the light-emitting devices 2 away from the substrate 1, and a distance between the end of the nozzle and the light-emitting devices 2 in the thickness direction of the substrate 1 may be approximately 1 mm.

In S220, as shown in FIG. 28(*d*), a second light dimming sub-layer 31*b* is formed on a surface of the first light dimming sub-layer 31*a* away from the substrate by inkjet printing. The second light dimming sub-layer 31*b* covers the first light dimming sub-layer 31*a*, and a gap exists between a portion of the second light dimming sub-layer 31*b* between the two adjacent groups of light-emitting devices and the at least one side face of the light-emitting device(s) 2 adjacent thereto.

For example, since the material of the first light dimming layer 3 is flowable, after being printed on the surface of the first light dimming sub-layer 31*a* away from the substrate 1, the material of the first light dimming sub-layer 31*a* may flow.

For example, an orthographic projection of a film formed after the flowing and spreading (which will form the second light dimming sub-layer 31*b* after being cured) on the substrate 1 coincides with an orthographic projection of the first light dimming sub-layer 31*a* on the substrate 1. That is, the film formed after the flowing and spreading covers the surface of the first light dimming sub-layer 31*a* away from the substrate. In this case, the second light dimming sub-layer 31*b* formed after the curing process is located only on the surface of the first light dimming sub-layer 31*a* away from the substrate 1.

For another example, an orthographic projection of the first light dimming sub-layer 31*a* on the substrate 1 is located within the orthographic projection of the film formed after the flowing and spreading on the substrate 1. That is, the film formed after the flowing and spreading covers the surface of the first light dimming sub-layer 31*a* away from the substrate and at least a portion of side faces of the first light dimming sub-layer 31*a*. In this case, the second light dimming sub-layer 31*b* formed after the curing process is not only located on the surface of the first light dimming sub-layer 31*a* away from the substrate 1, but also covers at least a portion of the side faces of the first light dimming sub-layer 31*a*.

Here, on the basis that the film formed after the flowing and spreading covers at least a portion of the side faces of the first light dimming sub-layer 31*a*, there may be a gap between a portion, between two adjacent groups of light-emitting devices 2, of the film formed after the flowing and spreading and at least one side face of light-emitting devices 2 adjacent thereto; or, the portion of the film formed after the flowing and spreading may be in contact with the light-emitting devices 2 adjacent thereto. That is, there may be a gap between a portion, between two adjacent groups of light-emitting devices 2, of the second light dimming sub-layer 31*b* formed after the curing process and the light-emitting devices 2 adjacent thereto; or, the portion of the second light dimming sub-layer 31*b* formed after the curing process may be in contact with the light-emitting devices 2 adjacent thereto.

It will be noted that, after the second light dimming sub-layer 31*b* is formed, light dimming sub-layers 31 may be sequentially formed in a stack on a side of the second light dimming sub-layer 31*b* away from the substrate 1. As for the description of the structures of the light dimming sub-layers 31 formed subsequently, reference may be made to the description of the structure of the second light dimming sub-layer 31*b*, and details will not be repeated here.

Figure 30:
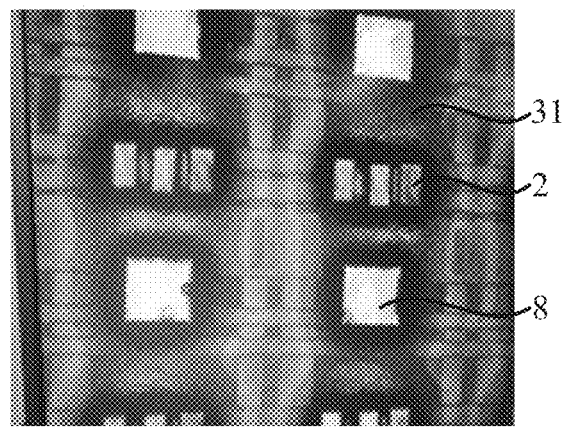
FIG. 30 is a structural diagram of a light dimming sub-layer, in accordance with some embodiments of the present disclosure.
Figure 31:
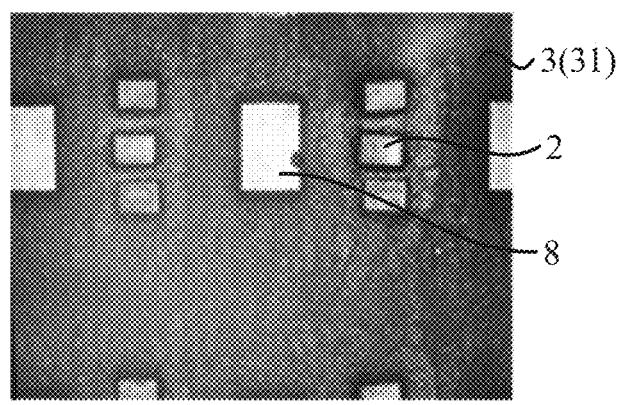
FIG. 31 is a structural diagram of a light dimming layer, in accordance with some embodiments of the present disclosure.

For example, in a case where the distance between the surface of the first light dimming layer 3 away from the substrate 1 and the substrate 1 is 80 μm, and the thickness of the light dimming sub-layer 31 formed each time is 5 μm, a structural diagram of 8 light dimming sub-layers 31 that are formed in a stack in sequence may be as shown in FIG. 30. The 8 light dimming sub-layers 31 may, for example, be located in a surrounding region of the light-emitting devices 2. A structural diagram of 16 light dimming sub-layers 31 that are formed in a stack may be as shown in FIG. 31. The 16 light dimming sub-layers 31 may, for example, cover regions of the substrate 1 other than regions covered by the light-emitting devices 2 and regions covered by functional devices 8 provided on the substrate 1.

For example, all the light dimming sub-layers 31 may be made of the same material, so that the hardness, color and the like of the light dimming sub-layers 31 are the same.

Of course, all the light dimming sub-layers 31 may also be made of different materials, so that the hardness, color and the like of the light dimming sub-layers 31 are different, which may be determined according to actual needs. For example, in a direction parallel to the thickness direction of the substrate 1 and moving away from the substrate 1, the hardness of the light dimming sub-layers 31 gradually decreases; or, the color of the light dimming sub-layers 31 gradually becomes lighter.

In S300, as shown in FIGS. 28(*f*) and 29(*d*), a first fixing layer 4 is formed on a side of the plurality of light-emitting devices 2 away from the substrate 1 and on a side of the first light dimming layer 3 away from the substrate 1 by inkjet printing. The first fixing layer 4 is a light-transmitting film, and is configured to fix the plurality of light-emitting devices 2 and the first light dimming layer 3.

For example, a material of the first light dimming layer 4 includes a flowable light-transmitting material.

Since the material of the first fixing layer 4 is flowable, during a process of forming the first fixing layer 4 on the side of the plurality of light-emitting devices 2 away from the substrate 1 and the side of the first light dimming layer 3 away from the substrate 1 by inkjet printing, the flowable light-transmitting material may be printed on the side of the plurality of light-emitting devices 2 away from the substrate 1 and the side of the first light dimming layer 3 away from the substrate 1 by using an inkjet printing device, and then be cured to obtain the first fixing layer 4.

Here, in a case where there is a gap between a portion of the first light dimming layer 3 between two adjacent groups of light-emitting devices 2 and the light-emitting device(s) 2 adjacent thereto, the material of the first fixing layer 4 will flow into and fill the gap. Moreover, after the first fixing layer 4 is obtained by curing, the surface of the first fixing layer 4 away from the substrate 1 is still a relatively flat surface. In a case where there is no gap between a portion of the first light dimming layer 3 between the two adjacent groups of light-emitting devices 2 and the light-emitting device(s) 2 adjacent thereto, the material of the first fixing layer 4 is only located on the side of the plurality of light-emitting devices 2 away from the substrate 1 and the side of the first light dimming layer 3 away from the substrate 1.

As for a manner of curing the first fixing layer 4, reference may be made to the manner of curing the first light dimming layer 3, and details will not be repeated here.

In some examples, the step of forming the first fixing layer 4 on the side of the plurality of light-emitting devices 2 away from the substrate 1 and the side of the first light dimming layer 3 away from the substrate 1 by inkjet printing (S300) includes, for example, forming a plurality of fixing sub-layers on the side of the plurality of light-emitting devices 2 away from the substrate 1 and the side of the first light dimming layer 3 away from the substrate 1 by inkjet printing. The plurality of fixing sub-layers are stacked to form the first fixing layer 4.

That is, the first fixing layer 4 is formed by a plurality of inkjet printing processes. For example, after a fixing film is formed each time, the fixing film is cured to form a fixing sub-layer.

For example, a thickness of the fixing film formed through an inkjet printing process may be approximately 10 μm, and the energy for curing the fixing film by an UV curing method may be approximately 3,000 mJ.

Figure 32:
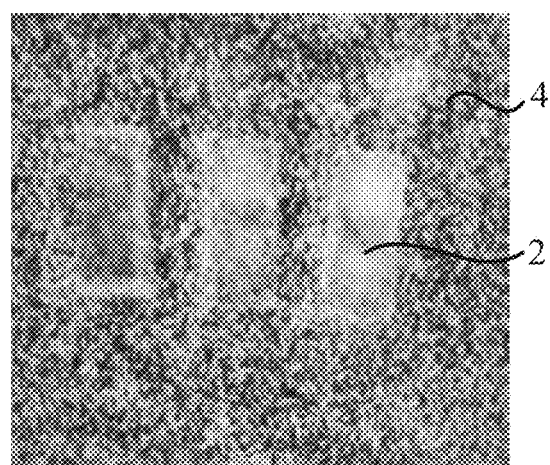
FIG. 32 is a structural diagram of a first fixing layer, in accordance with some embodiments of the present disclosure.

In an example where a surface of the first light dimming layer 3 away from the substrate 1 is flush with the surfaces of the light-emitting devices 2 away from the substrate 1, and a distance between a surface of the first fixing layer 4 proximate to the substrate 1 and a surface of the first fixing layer 4 away from the substrate 1 is 40 μm (that is, a thickness of the first fixing layer 4 is 40 μm), if a thickness of a single fixing sub-layer formed each time is 10 μm, the first fixing layer 4 may be obtained by forming four fixing sub-layers that are stacked in sequence through four inkjet printing processes. In this case, a structural diagram of the first fixing layer 4 is as shown in FIG. 32.

Figure 33:
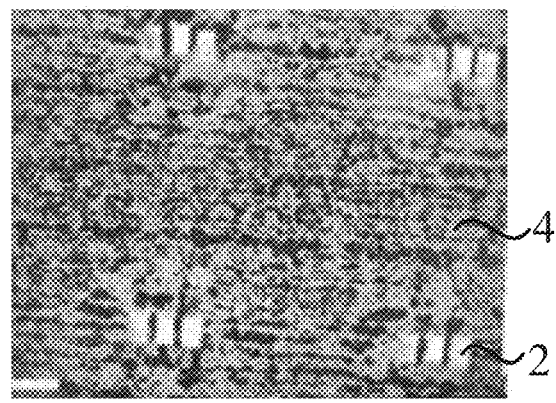
FIG. 33 is a structural diagram of another first fixing layer, in accordance with some embodiments of the present disclosure.

In an example where the surface of the first light dimming layer 31 away from the substrate 1 is flush with the surfaces of the light-emitting devices 2 away from the substrate 1, and the distance between the surface of the first fixing layer 4 proximate to the substrate 1 and a surface of the first fixing layer 4 away from the substrate 1 is 60 μm (that is, the thickness of the first fixing layer 4 is 60 μm), a structural diagram of the first fixing layer 4 is as shown in FIG. 33.

It will be noted that, in S100, a plurality of driving chips 81 are further provided on the substrate 1; in this case, the method for manufacturing the display substrate further includes forming a second light dimming layer 9 on surfaces of the driving chips 81 away from the substrate 1 by inkjet printing.

For example, in a case where the second light dimming layer 9 is made of the same material as the first light dimming layer 3, before S300, the step of forming the second light dimming layer 9 on the surfaces of the driving chips 81 away from the substrate 1 by inkjet printing includes: forming, by inkjet printing, films on the surfaces of the driving chips 81 away from the substrate 1 by using the material of the first light dimming layer 3. Each film is formed by a curing process after inkjet printing. The films are stacked to form the second light dimming layer 9.

For example, a thickness of a film formed by the inkjet printing process may be approximately 5 μm, and the energy for curing the film by an UV curing method may be approximately 3,000 mJ.

In a case where a thickness of the second light dimming layer 9 is 40 μm, and a thickness of the film formed each time is 5 μm, the second light dimming layer 9 may be obtained through eight inkjet printing processes. In a case where the thickness of the second light dimming layer 9 is 20 μm, and the thickness of the film formed each time is 5 μm, the second light dimming layer 9 may be obtained through four inkjet printing processes.

For example, in a case where the second light dimming layer 9 is made of the same material as the first fixing layer 4, the step of forming the second light dimming layer 9 on the surfaces of the driving chips 81 away from the substrate 1 through the inkjet printing process and the process of forming the first fixing layer 4 in S300 may be performed simultaneously.

For example, the thickness of the second light dimming layer 9 is 40 μm; as for a process of forming the second light dimming layer 9, reference may be made to the process of forming the first fixing layer 4, and details will not be repeated here.

The beneficial effects that may be achieved by the method for manufacturing the display substrate provided in some embodiments of the present disclosure are the same as the beneficial effects that may be achieved by the display substrate 100 provided in some of the embodiments described above, and details will not be repeated here.

In addition, the embodiments of the present disclosure adopts the inkjet printing technology to form the first light dimming layer 3, it may be possible to prevent the material of the first light dimming layer 3 (i.e., the light-absorbing material) from being formed on the surfaces of the light-emitting devices 2 away from the substrate 1, and thus avoid a decrease in the light extraction efficiency of the light-emitting devices 2 and an increase in the power consumption of the display substrate 100. Moreover, the inkjet printing process has a high printing accuracy, and a surface flatness of the first light dimming layer 3 and/or the first fixing layer 4 formed by the plurality of inkjet printing processes is relatively high, which may improve the appearance of the display substrate 100.

In some embodiments, as shown in FIG. 27, before S200, the method for manufacturing the display substrate further include step 150 (S150).

In S150, as shown in FIG. 29(a), a fixing pattern 51 is formed on a side of each group of light-emitting devices 2 away from the substrate 1 by inkjet printing. Each fixing pattern 51 covers and surrounds a group of light-emitting devices 2, so as to fix the group of light-emitting devices 2. A plurality of fixing patterns 51 form the second fixing layer 5.

Here, as for the structures of the fixing pattern 51 and the second fixing layer 5, reference may be made to the description in some embodiments described above, and details will not be repeated here.

In some examples, a material of the second fixing layer 5 includes a flowable light-transmitting material. The fixing patterns 51 may be, for example, formed through a plurality of inkjet printing processes.

For example, a group of light-emitting devices 2 includes three light-emitting devices 2, and each fixing pattern 51 fixes three light-emitting devices 2. For example, in inkjet printing processes performed first, a film formed in each inkjet printing process may be located between each two adjacent light-emitting devices 2 of the three light-emitting devices 2, and surround the three light-emitting devices 2 and be in contact with each side face of the three light-emitting devices 2. In inkjet printing processes performed later, a film formed by each inkjet printing process may be located only on a side of the three light-emitting devices 2 away from the substrate 1 to cover the three light-emitting devices 2.

Here, after a film is formed by each inkjet printing process, the film may be cured and shaped, and then a next film is formed on a side of the film away from the substrate 1.

After the second fixing layer 5 is formed, as shown in FIG. 29(c), a portion of the first light dimming layer 3 may be formed between two adjacent groups of light-emitting devices 2 by inkjet printing. For example, a portion of the first light dimming layer 3 is formed between each two adjacent fixing patterns 51 by inkjet printing. The portion of the first light dimming layer 3 is in contact with the fixing patterns 51.

Figure 26:
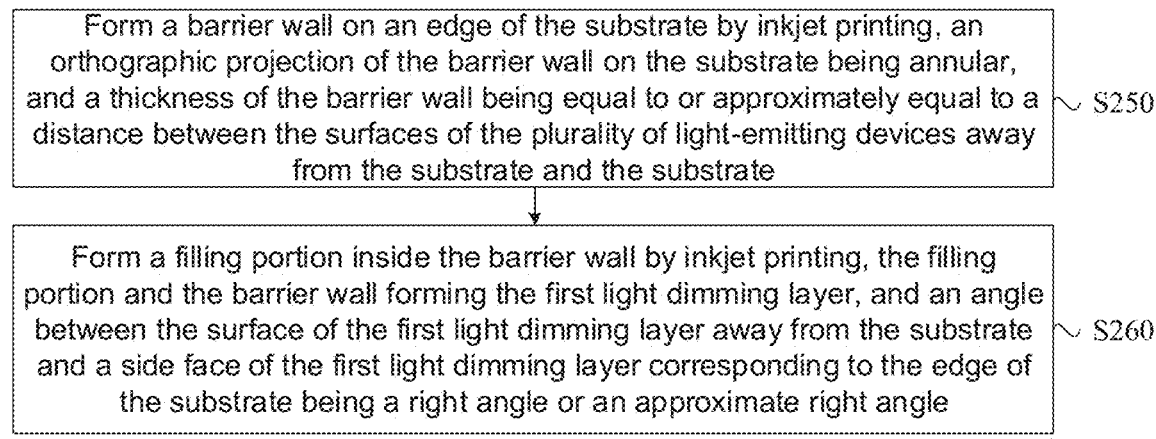
FIG. 26 is a flowchart of another steps in S200 in the flowchart shown in FIG. 24.

In some embodiments, as shown in FIG. 26, the step of forming the first light dimming layer 3 on the side of the substrate 1 by inkjet printing (S200) includes steps 250 and 260 (S250 and S260).

In S250, as shown in FIGS. 28(b) and 29(b), a barrier wall 35 is formed on an edge of the substrate 1 by inkjet printing. An orthographic projection of the barrier wall 35 on the substrate 1 is annular, and a thickness of the barrier wall 35 is equal to or approximately equal to a distance between the surfaces of the plurality of light-emitting devices 2 away from the substrate 1 and the substrate 1.

In some examples, the barrier wall 35 may be formed through a plurality of inkjet printing processes. As for a process of forming the barrier wall 35, reference may be made to the process of forming the plurality of light dimming sub-layers 31, and details will not be repeated here.

For example, after each inkjet printing process, a portion of the barrier wall 35 may be formed. An orthographic projection of the portion of the barrier wall 35 on the substrate 1 is annular.

In some examples, in a case where the substrate 1 is in the shape of a circle, the orthographic projection of the barrier wall 35 on the substrate 1 is in the shape of an annulus, and an outer boundary of the orthographic projection of the annulus coincides with the edge of the substrate 1. In a case where the substrate 1 is in the shape of a polygon, the orthographic projection of the barrier wall 35 on the substrate 1 is in the shape of a polygonal annulus, and an outer boundary of the orthographic projection of the polygonal annulus coincides with the edge of the substrate 1.

In some examples, as shown in FIGS. 28(b) and 29(b), in the thickness direction of the substrate 1, a section of the barrier wall 35 may be in the shape of a rectangle or an approximate rectangle. The approximate rectangle refers to a shape that may have an irregular portion compared with a regular rectangle.

For example, considering process errors of manufacturing the display substrate 100 and physical seams after a plurality of display substrates 100 are spliced together, a distance between a light-emitting device 2 closest to the edge of the substrate 1 and the edge of the substrate 1 is in a range of 100 μm to 200 μm. After the barrier wall 35 is formed, a width of the barrier wall 35 may be 10% to 20% of the distance between the light-emitting device 2 closest to the edge of the substrate 1 and the edge of the substrate 1.

Based on this, the width of the barrier wall 35 (i.e., a dimension of the section of the barrier wall 35 in the direction perpendicular to the thickness direction of the substrate 1) may be in a range of 20 μm to 40 μm. For example, the width of the barrier wall 35 is 20 μm, 23 μm, 29 μm, 37 μm or 40 μm.

In S260, as shown in FIGS. 28(e) and 29(c), a filling portion 36 is formed inside the barrier wall 35 by inkjet printing. The filling portion 36 and the barrier wall 35 form the first light dimming layer 3. An angle between the surface d of the first light dimming layer 3 away from the substrate 1 and a side face e of the first light dimming layer 3 corresponding to the edge of the substrate 1 is a right angle or an approximate right angle.

In some examples, the filling portion 36 may be formed by a plurality of inkjet printing processes. As for a process of forming the filling portion 36, reference may be made to the process of forming the plurality of light dimming sub-layers 31, and details will not be repeated here. Each light dimming sub-layer 31 includes a portion of the barrier wall 35, and a portion of the filling portion 36.

In some examples, as shown in FIG. 28(e), the filling portion 36 is located in a space enclosed by the barrier wall 35, and a surface of the filling portion 36 away from the substrate 1 is flush with or approximately flush with a surface of the barrier wall 35 away from the substrate 1, so that the angle between the surface d of the formed first light dimming layer 3 away from the substrate 1 and the side face e of the first light dimming layer 3 corresponding to the edge of the substrate 1 is a right angle or an approximate right angle. That is, the surface d of the first light dimming layer 3 away from the substrate 1 is directly connected to the side face e of the first light dimming layer 3 corresponding to the edge of the substrate 1 with no transition or substantially no transition; therefore, no chamfer or substantially no chamfer is formed therebetween.

It will be noted that, in the related art, a thickness of a barrier wall is relatively small (far less than a distance between surfaces of light-emitting devices 2 away from a substrate and the substrate). Consequently, after a filling portion is formed inside the barrier wall and a formed first light dimming layer reaches a desired thickness, due to the existence of the surface tension of liquids, a chamfer will be formed between a surface of the light dimming layer away from the substrate and a side face e' of the first light dimming layer corresponding to the edge of the substrate, which will affect the splicing effect of the display substrate.

However, the thickness of the barrier wall 35 in the embodiments of the present disclosure is relatively large (which may be achieved by, for example, extending a duration of the nozzle of the inkjet printing device staying over an edge position of the substrate 1), so that the angle between the surface d of the formed first light dimming layer 3 away from the substrate 1 and the side face e of the first light dimming layer 3 corresponding to the edge of the substrate 1 may be a right angle or an approximate right angle. As a result, the splicing effect of the display substrate 100 may be improved.

Moreover, on this basis, for example, the energy of curing the first fixing layer 4 formed subsequently may be increased, and the fluidity of the material of the first fixing layer 4 may be reduced, so as to further improve the splicing effect of the display substrate 100.

In addition, in the related art, black adhesive is usually formed in the gaps between the plurality of Mini LEDs and on the upper surfaces of the plurality of Mini LEDs by injection molding, so that the black adhesive is in contact with the side faces and the upper surface of each Mini LED. However, the solution of forming the black adhesive by injection molding cannot be used to manufacture narrow-bezel products and bezel-less products, and may result in a poor splicing effect of the substrate formed by splicing a plurality of display substrates together.

However, the present disclosure adopts the inkjet printing process to form the display substrate 100, which may be used to manufacture narrow bezel products and bezel-less products. On the basis of increasing the thickness of the barrier wall 35, compared with the display substrate formed by injection molding, the display substrate 100 provided in some embodiments of the present disclosure may have a better splicing effect.

In some embodiments, as shown in FIG. 28 (g), after S300, the method for manufacturing the display substrate further includes forming a plurality of light-transmitting particles 6 on a side of the first fixing layer 4 away from the substrate 1 by inkjet printing. A material of the light-transmitting particles 6 includes a flowable light-transmitting material.

In some examples, a time interval between ejecting the flowable light-transmitting material from the nozzle of the inkjet printing device and curing the flowable light-transmitting material may be controlled to obtain light-transmitting particles 6 with a desired shape.

For example, if the curing process begins when the flowable light-transmitting material drops to the side of the first fixing layer 4 away from the substrate 1, a shape of surfaces of the light-transmitting particles 6 may be, for example, a pyramid or a wedge.

For example, if the curing process begins after the flowable light-transmitting material drops on the side of the first fixing layer 4 away from the substrate 1 for a period of time, the shape of the surfaces of the light-transmitting particles 6 may be, for example, an arc surface or a spherical surface.

In some examples, a thickness of each light-transmitting particle 6 is 9 μm. In this case, a process of forming the light-transmitting particles 6 may be as follows: forming a pattern with a thickness of 9 μm by an inkjet printing process, and then curing the pattern by an UV curing process to obtain the light-transmitting particles 6. The energy of the curing process may be 3,000 mJ.

In some embodiments, after the display substrate 100 is formed, the display substrate 100 may be baked to further cure the structures formed by the inkjet printing processes, so that the shapes of the structures are more stable.

For example, a temperature for baking the structures is 120° C., and the duration is 1 h.

It will be noted that, as can be seen from the descriptions above, the method for manufacturing the display substrate 100 provided in the present disclosure has high manufacturing accuracy, and may realize manufacturing of small-sized patterns. In this way, in a case where there is a need to reduce reflection of light at a partial region of the display substrate 100 or a narrow side face of the display substrate 100 (for example, a side face of the substrate 1 in the thickness direction of the substrate), the method for manufacturing the display substrate 100 provided in the present disclosure may be adopted to print a flowable light-absorbing material (for example, the material of the first light dimming layer 3) at a corresponding position, and then cure the material.

Figure 34:
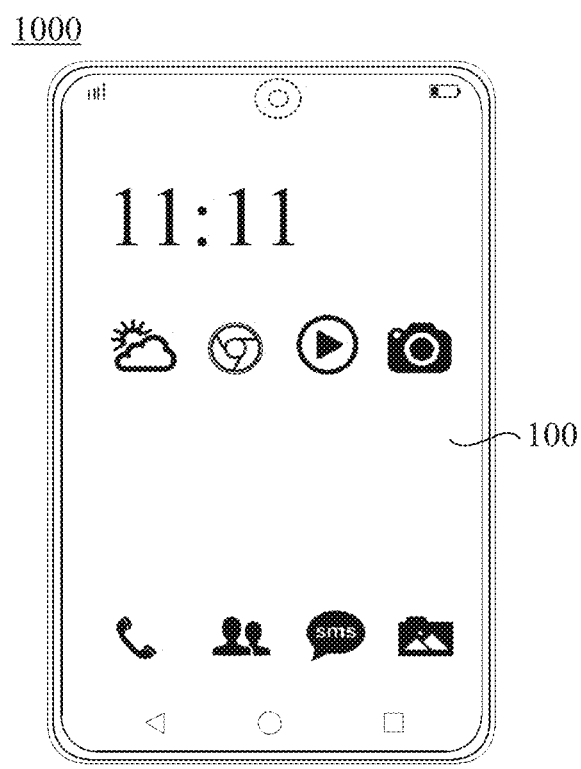
FIG. 34 is a structural diagram of a display apparatus, in accordance with some embodiments of the present disclosure.

Some embodiments of the present disclosure provide a display apparatus 1000. As shown in FIG. 34, the display apparatus 1000 includes the display substrate 100 provided in some of the above embodiments.

The display substrate 100 included in the display apparatus 1000 has the same structure and beneficial effects as the display substrate 100 provided in some of the above embodiments, and details will not be repeated here.

In some examples, the display apparatus 1000 further includes a housing for installing the display substrate 100, and/or a camera installed in the display substrate 100.

In some embodiments, the display apparatus 1000 is any product or component having a display function, such as a mobile phone, a tablet computer, a television, a monitor, a notebook computer, a digital photo frame, or a navigator.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate, comprising:
   a substrate;
   a plurality of light-emitting devices disposed on a side of the substrate, the plurality of light-emitting devices being arranged at intervals from each other and divided into a plurality of groups of light-emitting devices, each group of light-emitting devices including at least one light-emitting device;
   a first light dimming layer disposed on the side of the substrate, the first light dimming layer including portions each located between two adjacent groups of light-emitting devices, wherein a gap exists between a portion of the first light dimming layer and at least one side face of at least one light-emitting device(s) adjacent thereto; and
   a first fixing layer disposed on a side of the plurality of light-emitting devices and the first light dimming layer away from the substrate, a portion of the first fixing layer being located in the gap, and the first fixing layer being a light-transmitting film.

2. The display substrate according to claim 1, wherein the first light dimming layer includes a plurality of light dimming sub-layers that are stacked;
   the plurality of light dimming sub-layers include a first light dimming sub-layer and a second light dimming sub-layer that are stacked in a direction parallel to a thickness direction of the substrate and moving away from the substrate;
   an orthographic projection of the first light dimming sub-layer on the substrate coincides with or is located within an orthographic projection of the second light dimming sub-layer on the substrate.

3. The display substrate according to claim 1, wherein a gap exists between the portion of the first light dimming layer and each side face of the at least one light-emitting device adjacent thereto; or
   each group of light-emitting devices includes one light-emitting device.

4. The display substrate according to claim 1, wherein an outer boundary of an orthographic projection of the first light dimming layer on the substrate approximately coincides with an edge of the substrate; and
   an angle between a surface of the first light dimming layer away from the substrate and a side face of the first light dimming layer corresponding to the edge of the substrate is approximately a right angle.

5. The display substrate according to claim 1, wherein in a thickness direction of the substrate, a portion of the first light dimming layer located between two adjacent light-emitting devices has a plurality of cross sections perpendicular to the thickness direction of the substrate;

an orthographic projection of a cross section, other than a cross section closest to the substrate and a cross section farthest away from the substrate, on the substrate is located within an orthographic projection of the cross section closest to the substrate on the substrate.

6. The display substrate according to claim 5, wherein a shape of a section, taken along a plane parallel to the thickness direction of the substrate and a connection line of centers of the two adjacent light-emitting devices, of the portion of the first light dimming layer located between the two adjacent light-emitting devices includes a trapezoid or an approximate trapezoid.

7. The display substrate according to claim 6, wherein in a direction parallel to the thickness direction of the substrate to and moving away from the substrate, areas of orthographic projections of the plurality of cross sections on the substrate decrease in order; and a length of a bottom base of the trapezoid or the approximate trapezoid proximate to the substrate is greater than a length of a top base of the trapezoid or the approximate trapezoid away from the substrate; or the shape of the section, taken along the plane parallel to the thickness direction of the substrate and the connection line of the centers of the two adjacent light-emitting devices, of the portion of the first light dimming layer located between the two adjacent light-emitting devices includes the approximate trapezoid, a top base of the approximate trapezoid away from the substrate smoothly transitions to a side edge of the approximate trapezoid located between the top base and a bottom base of the approximate trapezoid that is proximate to the substrate.

8. The display substrate according to claim 1, further comprising a second fixing layer, wherein the second fixing layer is a light-transmitting layer;

the second fixing layer includes a plurality of fixing patterns that are arranged at intervals from each other;

a fixing pattern surrounds a group of light-emitting devices to fix the group of light-emitting devices;

a portion of the first light dimming layer is located in a gap between any two adjacent fixing patterns of the plurality of fixing patterns, and is in contact with the two adjacent fixing patterns; and the first fixing layer is located on a side of the second fixing layer and the first light dimming layer away from the substrate.

9. The display substrate according to claim 8, wherein a shape of a section, taken along a plane parallel to a thickness direction of the substrate and a connection line of centers of two adjacent light-emitting devices, of the portion of the first light dimming layer located between the two adjacent groups of light-emitting devices includes a trapezoid or an approximate trapezoid; a length of a bottom base of the trapezoid or approximate trapezoid proximate to the substrate is less than a length of a top base of the trapezoid or approximate trapezoid away from the substrate; or the group of light-emitting devices surrounded by the fixing pattern includes at least two light-emitting devices, a light-emitting device of the at least two light-emitting devices is configured to emit light of a single color, and light emitted by all of the at least two light-emitting devices is of at least one color.

10. The display substrate according to claim 1, further comprising a plurality of light-transmitting particles disposed on a side of the first fixing layer away from the substrate, the plurality of light-transmitting particles being configured to change a propagation direction of at least a portion of light entering the plurality of light-transmitting particles.

11. The display substrate according to claim 10, wherein the plurality of light-transmitting particles are arranged in an array, a distance between any two adjacent light-transmitting particles is in a range of 95 μm to 105 μm, inclusive;

a thickness of each light-transmitting particle is in a range of 6 μm to 12 μm, inclusive;

a dimension of an orthographic projection of each light-transmitting particle on the substrate is in a range of 45 μm to 55 μm, inclusive;

and/or, a shape of surfaces of the plurality of light-transmitting particles includes at least one of a pyramid, a wedge, an arc surface and a spherical surface.

12. The display substrate according to claim 1, further comprising a plurality of functional devices, wherein at least one functional device is disposed on a same side of the substrate as the plurality of light-emitting devices;

the at least one functional device is configured to provide control signals for the plurality of light-emitting devices.

13. The display substrate according to claim 12, wherein relative to the substrate, a surface of the first fixing layer away from the substrate is higher than a surface of the at least one functional device away from the substrate.

14. The display substrate according to claim 12, wherein the plurality of functional devices include a plurality of driving chips;

the plurality of driving chips are located on a same side of the substrate as the plurality of light-emitting devices, a driving chip is electrically connected to a group of light-emitting devices, the driving chip is configured to provide control signals for the group of light-emitting devices;

the display substrate further comprises a second light dimming layer disposed on surfaces of the plurality of driving chips away from the substrate, and the second light dimming layer is configured to reduce reflection of light incident on the surfaces of the plurality of driving chips by the plurality of driving chips.

15. The display substrate according to claim 14, wherein a material of the second light dimming layer is same as a material of the first light dimming layer; or a material of the second light dimming layer is same as a material of the first fixing layer.

16. The display substrate according to claim 1, further comprising a light reflection layer disposed on a side faces of each light-emitting devices; the light reflection layer being configured to reflect light emitted by the light-emitting devices and incident on the light reflection layer.

17. The display substrate according to claim 1, wherein relative to the substrate, a surface of the first light dimming layer away from the substrate is higher than surfaces of the light-emitting devices away from the substrate, a ratio of a distance between a surface of the first light dimming layer away from the substrate and the substrate to a dimension of a light-emitting device in a direction perpendicular to a thickness direction of the substrate is greater than or equal to 1:1, and less than or equal to $\sqrt{3}:1$; or a ratio of a distance between a surface of the first light dimming layer away from the substrate and the substrate to a dimension of a light-emitting device in a direction perpendicular to a thickness direction of the substrate is greater than or equal to 1:1, and less than or equal to $\sqrt{3}:1$; or relative to the substrate, a surface of the first light dimming layer away from the substrate is lower than surfaces of the light-emitting devices away from the substrate, and a ratio of a distance between the surface of the first light dimming layer away from the substrate and the substrate to a distance between the surfaces of the light-emitting devices away from the substrate and the substrate is greater than or equal to 4:5, and less than 1:1.

18. A display apparatus, comprising the display substrate according to claim 1.

19. A method for manufacturing a display substrate, comprising:

providing a substrate;

providing a plurality of light-emitting devices on a side of the substrate at intervals from each other, the plurality of light-emitting devices being divided into a plurality of groups of light-emitting devices, each group of light-emitting devices includes at least one light-emitting device;

forming a first light dimming layer on the side of the substrate by inkjet printing, the first light dimming layer including portions each located between two adjacent groups of light-emitting devices, wherein a gap exists between a portion of the first light dimming layer and at least one side face of at least one light-emitting device adjacent thereto; and forming a first fixing layer on a side of the plurality of light-emitting devices away from the substrate and the first light dimming layer away from the substrate, a portion of the first fixing layer being located in the gap, and the first fixing layer being a light-transmitting layer.

20. The method for manufacturing the display substrate according to claim 19, wherein forming the first light dimming layer on the side of the substrate by inkjet printing includes:

forming a plurality of light dimming sub-layers on the side of the substrate by inkjet printing in sequence, the plurality of light dimming sub-layers being stacked to form the first light dimming layer; wherein forming the plurality of light dimming sub-layers on the side of the substrate by inkjet printing in sequence includes:

forming a first light dimming sub-layer on the side of the substrate by inkjet printing, the first light dimming sub-layer including portions each located between two adjacent groups of light-emitting devices, a gap existing between a portion of the first light dimming sub-layer and light-emitting devices adjacent thereto; and forming a second light dimming sub-layer on a surface of the first light dimming sub-layer away from the substrate by inkjet printing, the second light dimming sub-layer covering the first light dimming sub-layer, wherein a gap exists between a portion of the second light dimming sub-layer and at least one side face of the at least one light-emitting device adjacent thereto; or forming the first light dimming layer on the side of the substrate by inkjet printing includes:

forming a barrier wall on an edge of the substrate by inkjet printing, wherein an orthographic projection of the barrier wall on the substrate is annular, and a thickness of the barrier wall is approximately equal to a distance between surfaces of the plurality of light-emitting devices away from the substrate and the substrate; and forming a filling portion inside the barrier wall, the filling portion and the barrier wall forming the first light dimming layer, wherein an angle between a surface of the first light dimming layer away from the substrate and a side face of the first light dimming layer corresponding to the edge of the substrate is approximately a right angle; or before forming the first light dimming layer on the side of the substrate by inkjet printing, the method further comprises:

forming a fixing pattern on a side of each group of light-emitting devices away from the substrate by inkjet printing, the fixing pattern surrounding a group of light-emitting devices to fix the group of light-emitting devices, a plurality of fixing patterns forming a second fixing layer.

* * * * *